United States Patent
Chang et al.

(10) Patent No.: US 9,252,265 B2
(45) Date of Patent: Feb. 2, 2016

(54) SHIELDED GATE TRENCH MOS WITH IMPROVED SOURCE PICKUP LAYOUT

(71) Applicant: ALPHA AND OMEGA SEMICONDUCTOR INCORPORATED, Sunnyvale, CA (US)

(72) Inventors: Hong Chang, Saratoga, CA (US); Yi Su, Sunnyvale, CA (US); Wenjun Li, Shanghai (CN); Limin Weng, Shanghai (CN); Gary Chen, Shanghai (CN); Jongoh Kim, Portland, OR (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/660,361

(22) Filed: Mar. 17, 2015

(65) Prior Publication Data
US 2015/0194522 A1 Jul. 9, 2015

Related U.S. Application Data

(60) Continuation of application No. 13/865,941, filed on Apr. 18, 2013, now Pat. No. 8,994,101, which is a division of application No. 12/722,384, filed on Mar. 11, 2010, now Pat. No. 8,431,457.

(51) Int. Cl.
*H01L 29/772* (2006.01)
*H01L 29/78* (2006.01)
(Continued)

(52) U.S. Cl.
CPC .......... *H01L 29/7813* (2013.01); *H01L 21/283* (2013.01); *H01L 27/088* (2013.01);
(Continued)

(58) Field of Classification Search
CPC ............ H01L 29/7813; H01L 29/4236; H01L 29/42368; H01L 29/4238; H01L 29/4933; H01L 29/66712

USPC .................. 257/302, 330–334, 341, E29.257, 257/E27.091, E29.201, E29.261, E29.262, 257/E21.585, E21.655; 438/242, 259, 270, 438/430–432
See application file for complete search history.

(56) References Cited

U.S. PATENT DOCUMENTS 5,434,435 A   7/1995   Baliga
5,998,833 A  12/1999   Baliga
(Continued)

OTHER PUBLICATIONS

Final Office Action for U.S. Appl. No. 13/865,941, dated Oct. 23, 2014.
(Continued)

*Primary Examiner* — Laura Menz
*Assistant Examiner* — Maliheh Malek
(74) *Attorney, Agent, or Firm* — Joshua D. Isenberg; JDI Patent

(57) ABSTRACT

A method for fabricating a semiconductor device includes forming a plurality of trenches using a first mask. The trenches include source pickup trenches located in outside a termination area and between two adjacent active areas. First and second conductive regions separated by an intermediate dielectric region are formed using a second mask. A first electrical contact to the first conductive region and a second electrical contact to the second conductive region are formed using a third mask and forming a source metal region. Contacts to a gate metal region are formed using a fourth mask. A semiconductor device includes a source pickup contact located outside a termination region and outside an active region of the device.

16 Claims, 44 Drawing Sheets

(51) Int. Cl.
- *H01L 21/283* (2006.01)
- *H01L 27/088* (2006.01)
- *H01L 29/40* (2006.01)
- *H01L 29/417* (2006.01)
- *H01L 29/66* (2006.01)
- *H01L 29/423* (2006.01)
- *H01L 21/265* (2006.01)
- *H01L 29/45* (2006.01)
- *H01L 29/49* (2006.01)
- *H01L 29/10* (2006.01)

(52) U.S. Cl.
CPC ............ *H01L29/402* (2013.01); *H01L 29/407* (2013.01); *H01L 29/41741* (2013.01); *H01L 29/66719* (2013.01); *H01L 29/66727* (2013.01); *H01L 29/66734* (2013.01); *H01L 29/7811* (2013.01); *H01L 29/7827* (2013.01); *H01L 21/26586* (2013.01); *H01L 29/1095* (2013.01); *H01L 29/4236* (2013.01); *H01L 29/4238* (2013.01); *H01L 29/42368* (2013.01); *H01L 29/42372* (2013.01); *H01L 29/456* (2013.01); *H01L 29/4933* (2013.01)

(56) References Cited

U.S. PATENT DOCUMENTS

| | | | |
|---|---|---|---|
| 6,100,577 A | 8/2000 | Linliu | |
| 6,690,062 B2 | 2/2004 | Henninger et al. | |
| 6,750,116 B1 | 6/2004 | Chen | |
| 7,470,588 B2 | 12/2008 | Cho et al. | |
| 7,473,603 B2 | 1/2009 | Kraft et al. | |
| 7,576,388 B1 | 8/2009 | Wilson et al. | |
| 7,701,002 B2 | 4/2010 | Seo et al. | |
| 7,772,642 B2 | 8/2010 | Marchant | |
| 7,897,462 B2 * | 3/2011 | Burke | H01L 29/407 257/E21.419 |
| 7,935,577 B2 | 5/2011 | Grebs et al. | |
| 8,174,067 B2 * | 5/2012 | Yedinak | H01L 29/0692 257/328 |
| 8,187,939 B2 | 5/2012 | Tai et al. | |
| 8,193,580 B2 | 6/2012 | Chen et al. | |
| 8,193,581 B2 | 6/2012 | Yedinak et al. | |
| 8,236,651 B2 | 8/2012 | Chen et al. | |
| 8,431,457 B2 | 4/2013 | Chang et al. | |
| 8,564,055 B2 | 10/2013 | Chen et al. | |
| 8,580,667 B2 * | 11/2013 | Lui | H01L 29/8613 257/E29.201 |
| 8,785,270 B2 * | 7/2014 | Su | H01L 29/872 257/E21.41 |
| 8,928,077 B2 * | 1/2015 | Lee | H01L 29/66712 257/328 |
| 8,994,101 B2 | 3/2015 | Chang et al. | |
| 2003/0178676 A1 * | 9/2003 | Henninger | H01L 29/42 257/340 |
| 2004/0065919 A1 | 4/2004 | Wilson et al. | |
| 2004/0185622 A1 | 9/2004 | Williams et al. | |
| 2006/0049455 A1 | 3/2006 | Jang et al. | |
| 2006/0273382 A1 | 12/2006 | Hshieh | |
| 2007/0155104 A1 | 7/2007 | Marchant et al. | |
| 2007/0194374 A1 | 8/2007 | Bhalla et al. | |
| 2008/0067584 A1 * | 3/2008 | Lui | H01L 21/823487 257/330 |
| 2008/0121986 A1 | 5/2008 | Hshieh | |
| 2008/0135931 A1 | 6/2008 | Challa et al. | |
| 2008/0150013 A1 | 6/2008 | Tai et al. | |
| 2008/0258213 A1 | 10/2008 | Yilmaz et al. | |
| 2008/0265289 A1 | 10/2008 | Bhalla | |
| 2009/0008709 A1 | 1/2009 | Yedinak et al. | |
| 2009/0014768 A1 | 1/2009 | Lin et al. | |
| 2009/0020810 A1 | 1/2009 | Marchant | |
| 2009/0072301 A1 | 3/2009 | Bhalla et al. | |
| 2009/0085074 A1 | 4/2009 | Su et al. | |
| 2009/0111231 A1 | 4/2009 | Grebs et al. | |
| 2009/0114968 A1 | 5/2009 | Wang et al. | |
| 2010/0038708 A1 | 2/2010 | Yilmaz et al. | |
| 2010/0052044 A1 | 3/2010 | Hirler | |
| 2010/0065904 A1 | 3/2010 | Pan et al. | |
| 2010/0140695 A1 * | 6/2010 | Yedinak | H01L 29/7397 257/334 |
| 2010/0140697 A1 | 6/2010 | Yedinak et al. | |
| 2011/0037120 A1 | 2/2011 | Chen et al. | |
| 2011/0039383 A1 * | 2/2011 | Chen | H01L 29/7813 438/270 |
| 2011/0049618 A1 | 3/2011 | Lee et al. | |
| 2011/0068386 A1 | 3/2011 | Tai et al. | |
| 2011/0127602 A1 | 6/2011 | Mallikarjunaswamy | |
| 2011/0133258 A1 | 6/2011 | Chen | |
| 2011/0136310 A1 * | 6/2011 | Grivna | H01L 29/407 438/270 |
| 2011/0212586 A1 | 9/2011 | Grebs et al. | |
| 2011/0220990 A1 * | 9/2011 | Chang | H01L 29/402 257/330 |
| 2011/0233667 A1 * | 9/2011 | Tai | H01L 29/407 257/334 |
| 2011/0244641 A1 | 10/2011 | Pan et al. | |
| 2011/0254086 A1 | 10/2011 | Hsieh | |
| 2011/0291186 A1 | 12/2011 | Yilmaz et al. | |
| 2011/0303975 A1 | 12/2011 | Yilmaz et al. | |
| 2011/0312138 A1 | 12/2011 | Yedinak et al. | |
| 2012/0058615 A1 | 3/2012 | Marchant et al. | |
| 2012/0098059 A1 | 4/2012 | Tai et al. | |
| 2012/0129328 A1 | 5/2012 | Chang et al. | |
| 2012/0142155 A1 | 6/2012 | Murphy et al. | |
| 2012/0187472 A1 | 7/2012 | Chang et al. | |
| 2012/0187474 A1 | 7/2012 | Rexer et al. | |
| 2012/0205737 A1 * | 8/2012 | Chen | H01L 29/407 257/331 |
| 2013/0075810 A1 * | 3/2013 | Hsieh | H01L 29/66348 257/328 |
| 2013/0228860 A1 | 9/2013 | Chang et al. | |
| 2014/0091386 A1 * | 4/2014 | Chen | H01L 29/407 257/330 |
| 2014/0134813 A1 * | 5/2014 | Chen | H01L 29/0865 438/270 |

OTHER PUBLICATIONS

Non-Final Office Action for U.S. Appl. No. 13/865,941, dated Jun. 24, 2013.

Notice of Allowance for U.S. Appl. No. 13/865,941, dated Nov. 26, 2014.

* cited by examiner

US 9,252,265 B2

SHIELDED GATE TRENCH MOS WITH IMPROVED SOURCE PICKUP LAYOUT

PRIORITY CLAIM

This application is a continuation of U.S. patent application Ser. No. 13/865,941, filed Apr. 18, 2013, the entire disclosures of which are incorporated herein by reference. U.S. patent application Ser. No. 13/865,941 is a divisional application claiming the benefit of priority of commonly assigned U.S. patent application Ser. No. 12/722,384, filed Mar. 11, 2010, the entire disclosures of which are incorporated herein by reference.

FIELD OF THE INVENTION

This invention generally relates to shielded gate trench MOS devices and more particularly to the methods for fabricating shielded gate trench MOS with the source poly pickup within the termination region.

BACKGROUND OF THE INVENTION

Many electronic circuit designs today have strict requirements on device performance parameters such as switching performance and on-state resistance. Power MOS devices are often used in such circuits. Shielded gate trench Metal Oxide Semiconductor Field Effect Transistors (MOSFETs) is a type of power MOS device that has good high frequency switching performance and low on-state resistance. Existing fabrication techniques for shielded gate MOSFETs are typically complex and expensive, usually requiring 6 or more masks to be applied during processing.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

INTRODUCTION

Figure 1A:
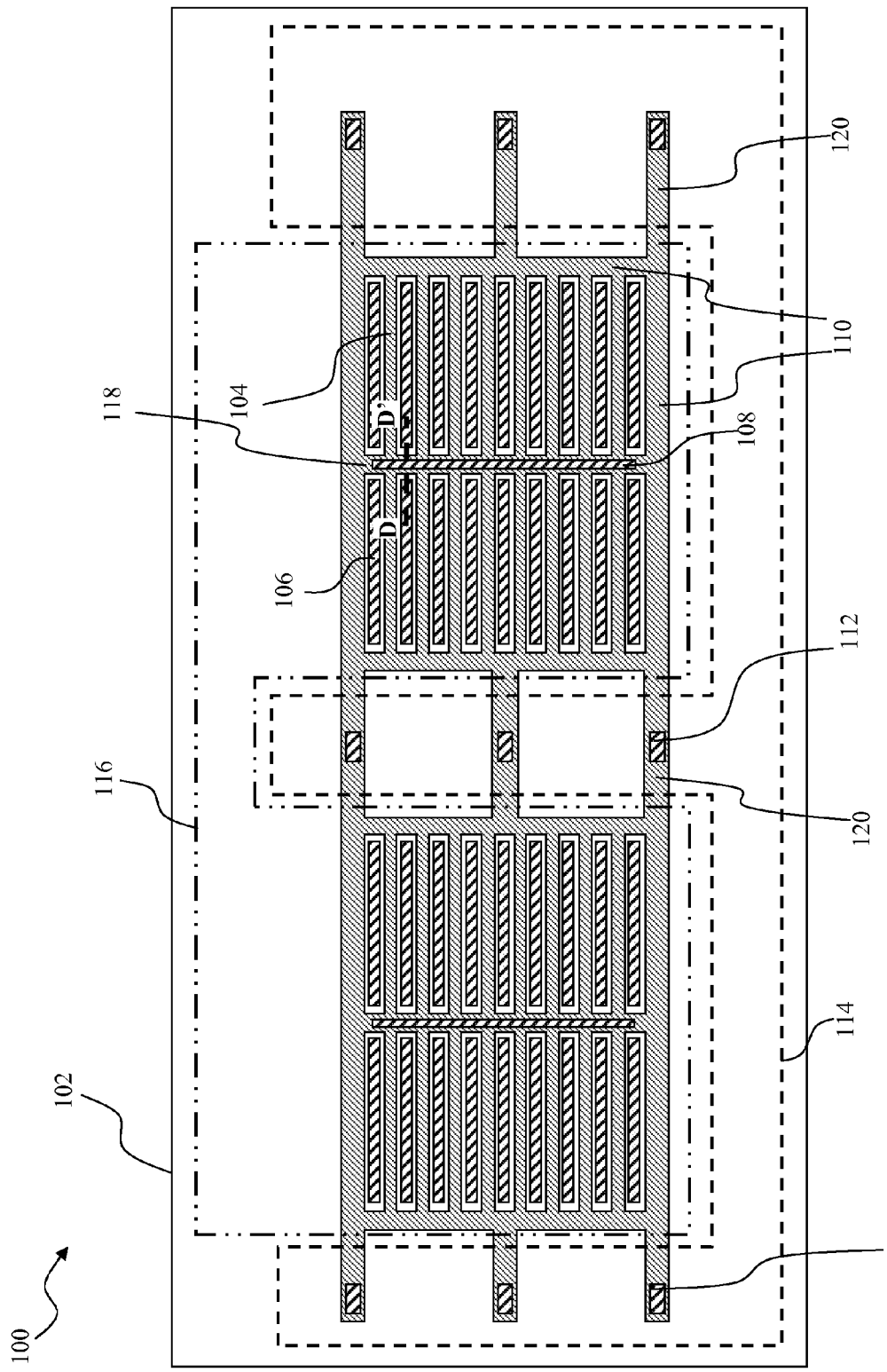
FIG. 1A is a diagram illustrating a top view of a conventional shielded gate MOSFET structure.

A method for fabricating a semiconductor device using only four masks is disclosed in U.S. patent application Ser. Nos. 12/583,191 and 12/583,192, both filed Aug. 14, 2009, both entitled "SHIELDED GATE TRENCH MOSFET DEVICE AND FABRICATION", the entire contents of which are incorporated herein by reference. The method includes forming a plurality of trenches, including applying a first mask, forming a first polysilicon region in at least some of the plurality of trenches, forming a inter-polysilicon dielectric region and a termination protection region, including applying a second mask, forming a second polysilicon region in the at least some of the plurality of trenches, forming a first electrical contact to the first polysilicon region and forming a second electrical contact to the second polysilicon region, including applying a third mask, disposing a metal layer, and forming a source metal region and a gate metal region, including applying a fourth mask. FIG. 1A of U.S. patent application Ser. No. 12/583,191, which is also FIG. 1A of this application, is a diagram illustrating a top view of a shielded gate MOSFET structure of this invention. As shown in FIG. 1A, a structure 100 is built on a semiconductor substrate 102. Active regions of the structure 100 include active gate trenches such as 104, in which gates are formed. The active regions further include source/body contact openings such as 106, in which contacts are formed to electrically connect source regions and body regions to the source metal 116. The active regions also include source pickup contacts such as 108, for making contact to the source (or shield) electrode in the lower part of the gate trenches. The source electrodes are typically made of polysilicon and are therefore referred to as source poly. In a source poly pickup contact, a contact metal is deposited in the source pickup trench 118 and is electrically connected through source poly pickup contact opening 108 to source metal 116, which in turn is electrically connected to the source and body regions of the device. The active regions are surrounded by trenches such as 110, which serve several purposes, including as termination trenches that separate high potential areas (such as the drain) from low potential areas (such as the source), and as gate runners configured to form electrical connections with the gate electrodes in active gate trenches. As shown in FIG. 1A, termination/gate runner trenches 110 are mostly covered by source metal 116, which, as will be shown in the cross sectional views below, is insulated from the gate electrodes in trenches 104 and 110 by a dielectric layer. Termination/gate runner trenches 110 further include portions that form gate runner extension trenches 120. The gate runner extension trenches extend into gate metal area 114 and serve as gate pickup trenches where gate pickup contact openings 112 are disposed for electrically connecting the gate runner to gate metal 114.

Figure 1B:
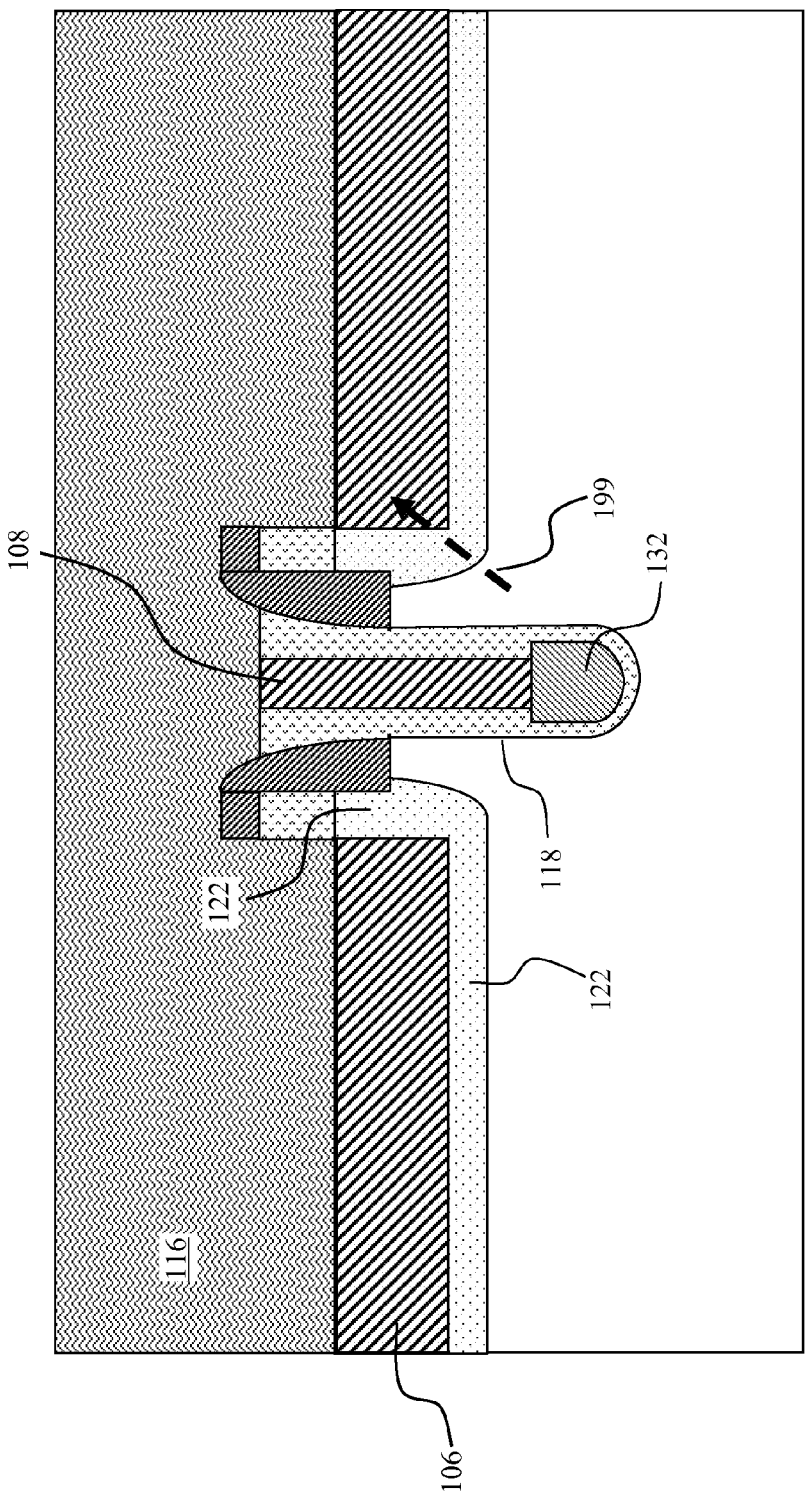
FIG. 1B is a diagram illustrating a cross sectional view of a low breakdown voltage problem with the conventional shielded gate taken along the line D-D' of the MOSFET structure of FIG. 1A.
Figure 19A:
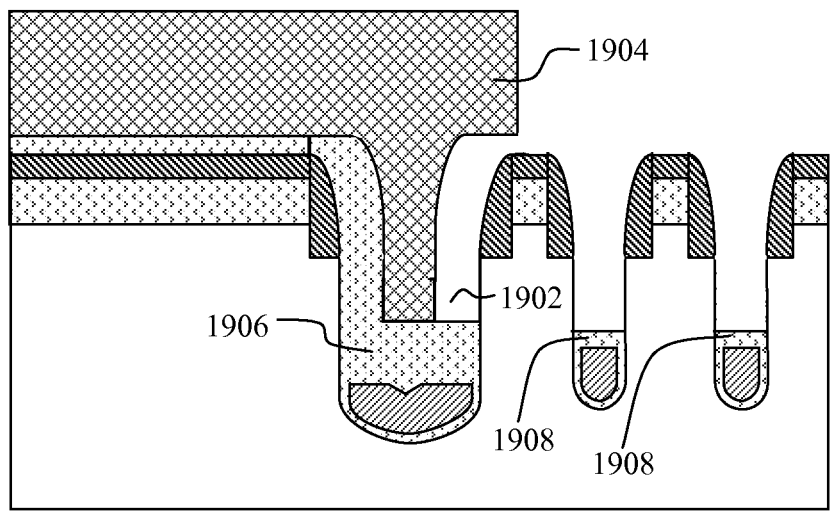
Figure 19B:
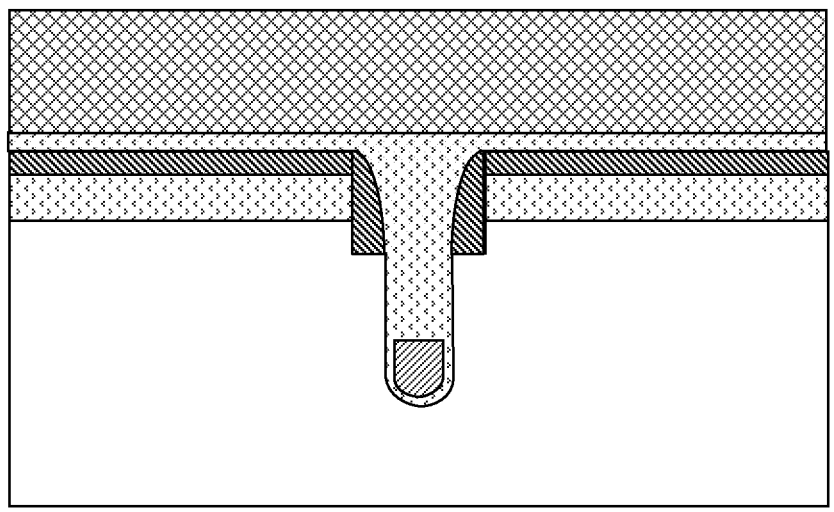
Figure 19L:
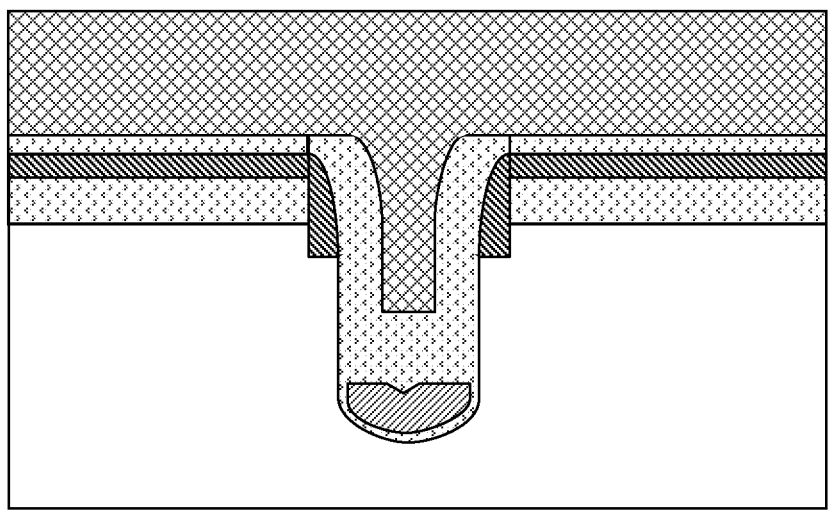

However, as can be seen in FIG. 19BB' of U.S. patent application Ser. No. 12/583,192, to build the source poly pickup 108 within the active region, a photo resist overhang has to be large enough to avoid overetching the oxide layer underneath—if too much oxide is etched away much, a gate poly will be formed in the source poly pickup trench, which is not desirable. In addition, it is desirable to avoid etching away too much of the nitride that lies under an oxide layer that is etched. A second potential problem is that the body implant in the nearby active cell region proximate the gate trenches 104 may be partially blocked by the overhang in the poly pickup region. That is to say, the body implant will be pulled back from the source poly pickup trench, as shown in FIG. 23BB' of U.S. patent application Ser. No. 12/583,192. In the final structure shown in FIG. 1B, the body regions 122 are pulled away from the source poly pickup trench 118. A source metal 116 makes contact to the source region (not shown) and the body region 122 through source/body contacts 106. The source metal 116 also makes contact with the source poly 132 at the source poly pickup trench 118. The applicants have discovered that the effect of the partial blocking of the body implant by the overhang is a possible performance drop The partial block of the body implant could reduce the body dose charge near the proximate the source poly pickup compared to the nearby active cell region. The reduced charge dose in the pickup region can cause a low drain-substrate break down voltage (BVDSS) path 199 to the source/body contact contacts 106, as shown in FIG. 1B.

One possible solution to this problem is to perform the body implant at an angle. However, even with angled implant there is previously unforeseen problem, the source pick up trench critical dimension (CD) is enlarged in the location where the active cell trench cross links to it due to lack of optical proximity correction (OPC) in the mask set. OPC refers to a photolithography enhancement technique that is commonly used to compensate for image errors due to diffraction or process effects. OPC is used to compensate for the fact that projected images may appear with irregularities such as line widths that are narrower or wider than designed due to the limitations of light to maintain the edge placement integrity of the original design. These irregularities can be corrected by changing the pattern on the photomask used for imaging. However, it adds cost in manufacturing and still cannot completely make the cross-linked area CD uniform.

Figure 1C:
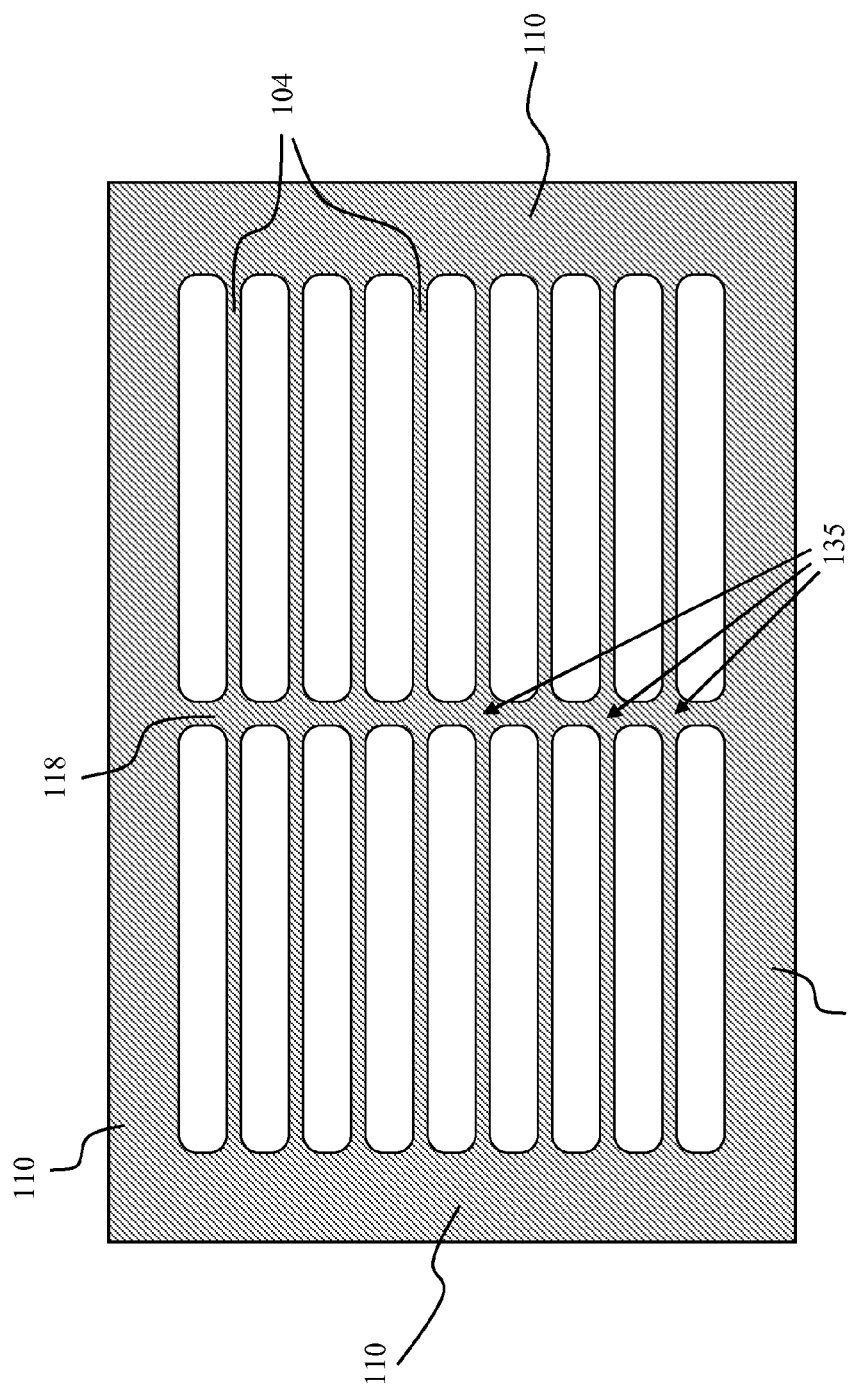
FIG. 1C is a diagram illustrating a top view of a non-uniform trench width problem with the conventional shielded gate MOSFET structure of FIG. 1A.

In other words, the previously unforeseen problem mentioned above is the non-uniform width of the source poly pickup trenches 118 at the intersections with active gate trenches 104. As shown in the top view of FIG. 1C, the width of the source poly pickup trench 118 "wiggles"—i.e. the source poly pickup trench 118 is wider around the intersections 135 with the active gate trenches 104. Gate runner/termination trenches 110 surround the active area. A gate poly may be formed in those wider portions of the source poly pickup trench, which is not acceptable.

Figure 35:
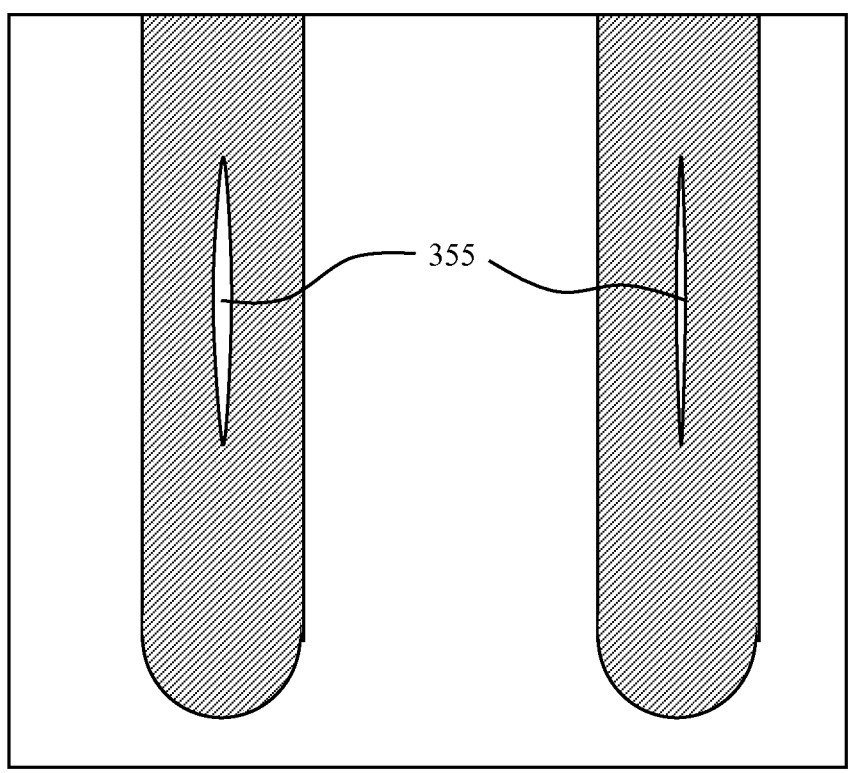
FIG. 35 is a cross-sectional diagram of a partially-fabricated MOSFET structure illustrating the problem of void formation during polysilicon fill of high aspect ratio trenches.

Another problem that has been observed during fabrication of devices with the process described in U.S. patent application Ser. No. 12/583,192 arises when the process is applied to active cells having a relatively small pitch, e.g., about 800 nanometers or less and high aspect ratio (ratio of nominal trench depth to nominal trench width). The problem is that with current poly deposition methods, voids 355 tend to form as illustrated in the cross sectional diagram shown in FIG. 35. Formation of voids during polysilicon fill of high aspect ratio (e.g., about 10:1 or greater) is common with current deposition techniques.

SOLUTIONS

In embodiments of the present invention, the solution to the problem of a low breakdown voltage path as a result of body implant blocking from the overhang is to relocate the source poly pickup contacts to a location outside the termination trenches 110 and away from the active cell regions. If the source poly pickups are located outside the active cell regions, they are removed from proximity to the active cells and so the low BV path cannot form due to the lack of a nearby source/body contact. There is no overhang issue here at all, because the mask completely covers that region. The width of the source poly pickup trench also does not wiggle, because this layout does not have the numerous intersections with the active gate trenches. Furthermore, if the source poly pickups are located outside the active cell regions the overlap of the second mask with the source poly pickup trench is no longer a critical dimension because the region surrounding the source poly pickup trench is now masked.

In alternative embodiments of the invention, the solution to the problem of void formation during filling of high aspect ratio and small pitch trenches is to fill the trenches using a partial deposition followed by an etch back to remove some of the deposited material from near the top of the trenches, followed by another deposition to completely fill the trenches without forming a void.

Embodiment

Figure 1D:
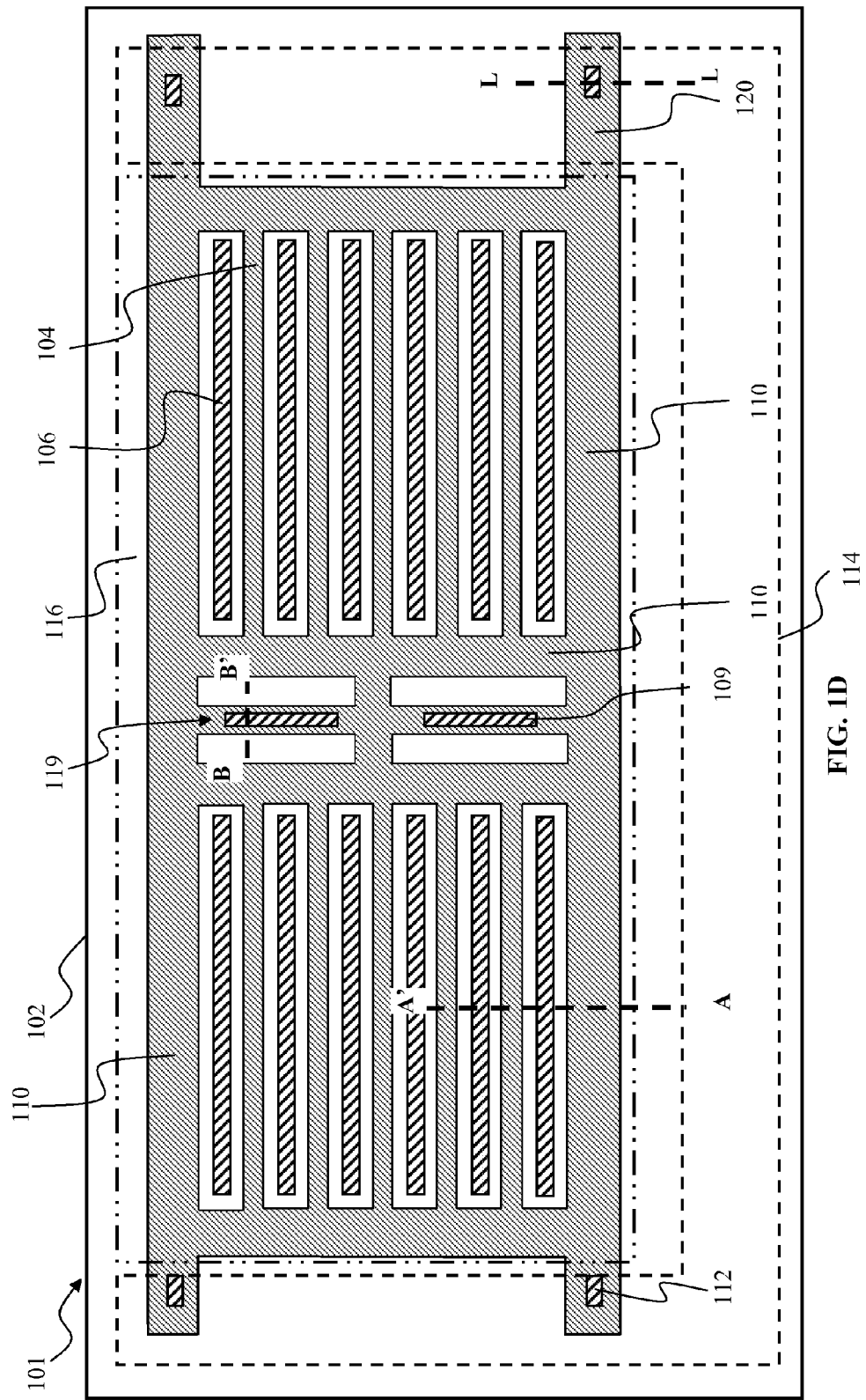
FIG. 1D is a diagram illustrating a top view of a shielded gate MOSFET structure according to an embodiment of the present invention.

Embodiments of the present invention include a method of fabricating a shielded gate trench MOS device also using only four masks but with the source poly pickup built outside the termination trenches. FIG. 1D is a diagram illustrating a top view of a shielded gate MOSFET structure 101 according to an embodiment of the present invention. Similar to structure 100, the structure 101 is built on a semiconductor substrate 102. Active regions of the structure include active gate trenches such as 104, in which gates are formed. The active regions further include source/body contact openings such as 106, in which contacts are formed to electrically connect source regions and body regions to the source metal 116. Each active region is surrounded by a gate runner/termination trench 110 formed by conductive material, e.g., polysilicon and asymmetric oxide walls formed in trenches that surround the active regions and that are electrically connected to each other. In this embodiment, a source metal 116 is electrically connected to conductive material formed in a pickup trench 119 by source pickup contacts such as 109 located outside the active regions, e.g., outside the termination regions that surround the active regions and in between adjacent active regions. As shown here, the source pickup trenches 119 are surrounded by gate runner/termination trenches 110.

Figure 1E:
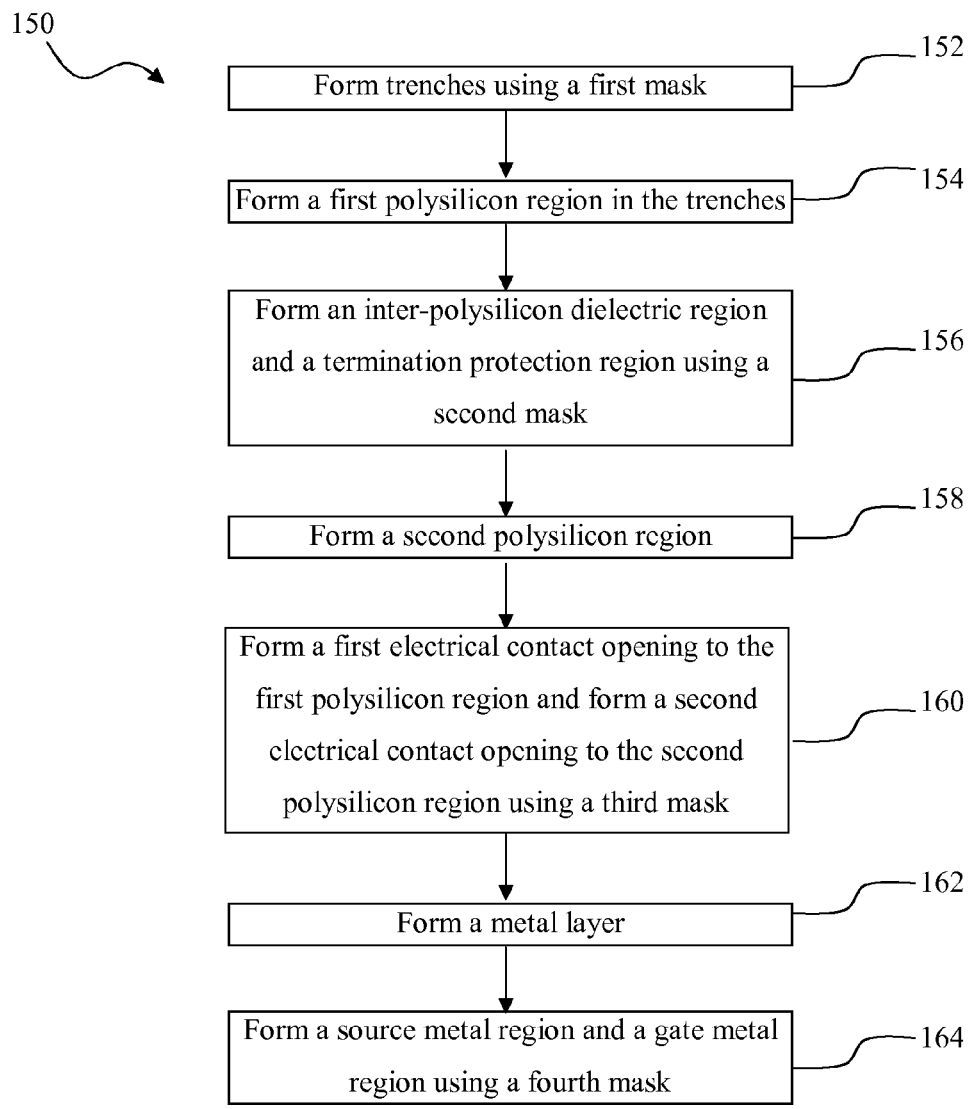
FIG. 1E is a flow diagram illustrating a process for fabricating a shielded gate MOSFET of the type depicted in FIG. 1D.

FIG. 1E is a flowchart illustrating an embodiment of a process 150 for fabricating a shielded gate MOSFET such as 101. The process 150 involves four masks. At step 152, a number of trenches are formed using a first mask (shown in FIG. 2). At step 154, a first set of conductive (e.g., polysilicon) regions are formed in the plurality of trenches. Currently polysilicon (poly) is the most commonly used conductive material for this type of trench MOS device. However, in principle, any conductive material such as tungsten silicide ($WSi_2$) (as well as other high temperature metals) can be used in the future if all the thermal processes from the device formation can support the use of such materials. The first conductive regions are sometimes also referred to as source poly, shield poly, or poly 1. At step 156, one or more intermediate dielectric regions and one or more termination protection regions are formed using a second mask (shown in FIG. 3). The intermediate dielectric regions are formed on the first set of conductive regions. The intermediate dielectric is sometimes referred to as inter-polysilicon or inter-poly dielectric (IPD).

At step 158, polysilicon is formed in some of the trenches to form a second set of conductive (e.g., polysilicon) regions. The second set of conductive regions is sometimes also referred to as gate poly or poly 2. At step 160, using a third mask (shown in FIG. 4), a first electrical contact opening is made to a gate conductor, and a second electrical contact opening is made to a source conductor. Where the source and gate conductors are made of polysilicon, the source conductor and gate conductor are referred to as gate poly and source poly, respectively. At step 162, a metal layer is formed. At step 164, a source metal region and a gate metal region are formed using a fourth mask (shown in FIG. 5).

Figure 4:
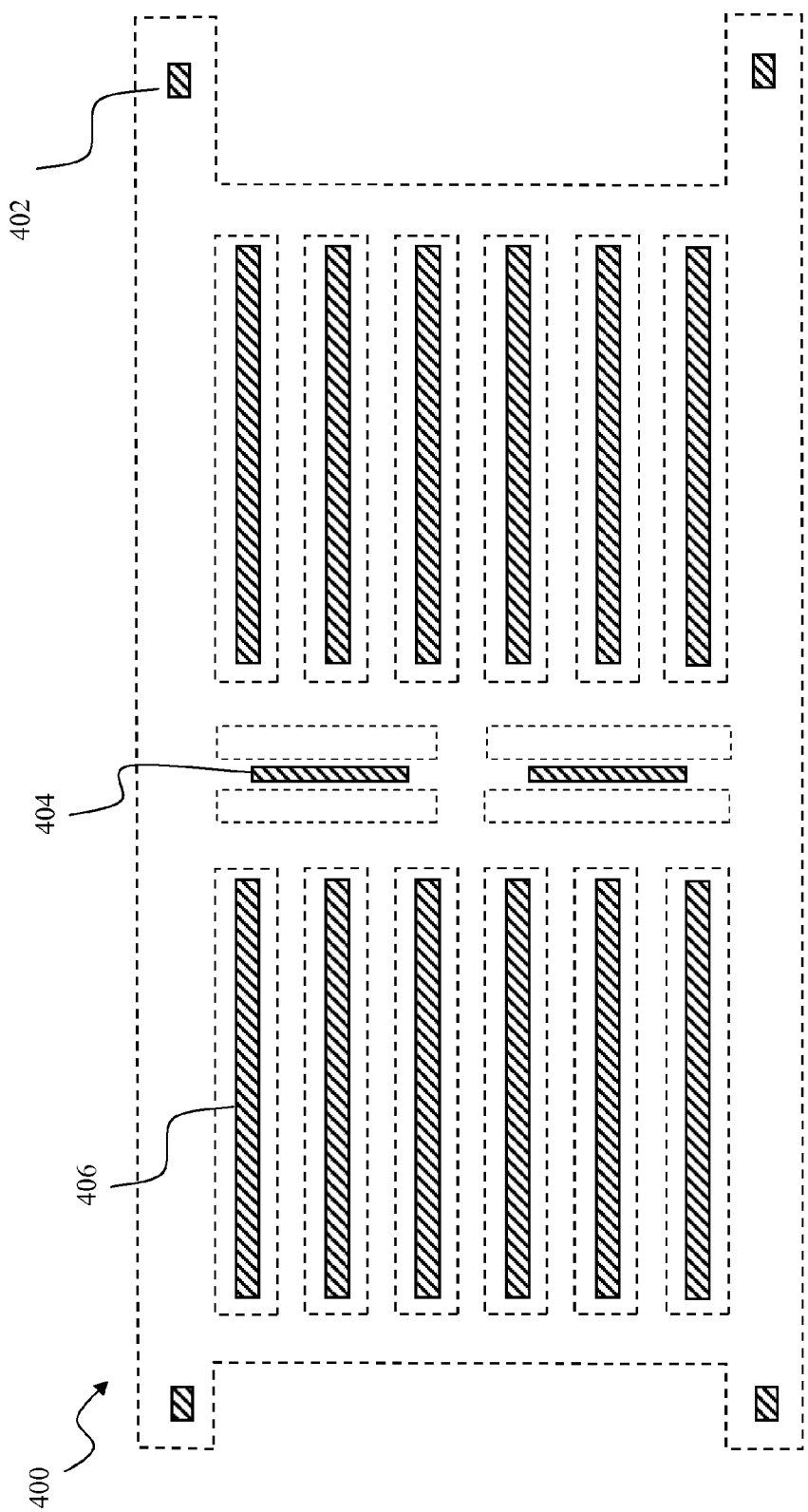
FIG. 4 is a diagram illustrating an example of a third mask used in used in the fabrication process for fabricating a shielded gate MOSFET of the type depicted in FIG. 1D.
Figure 5:
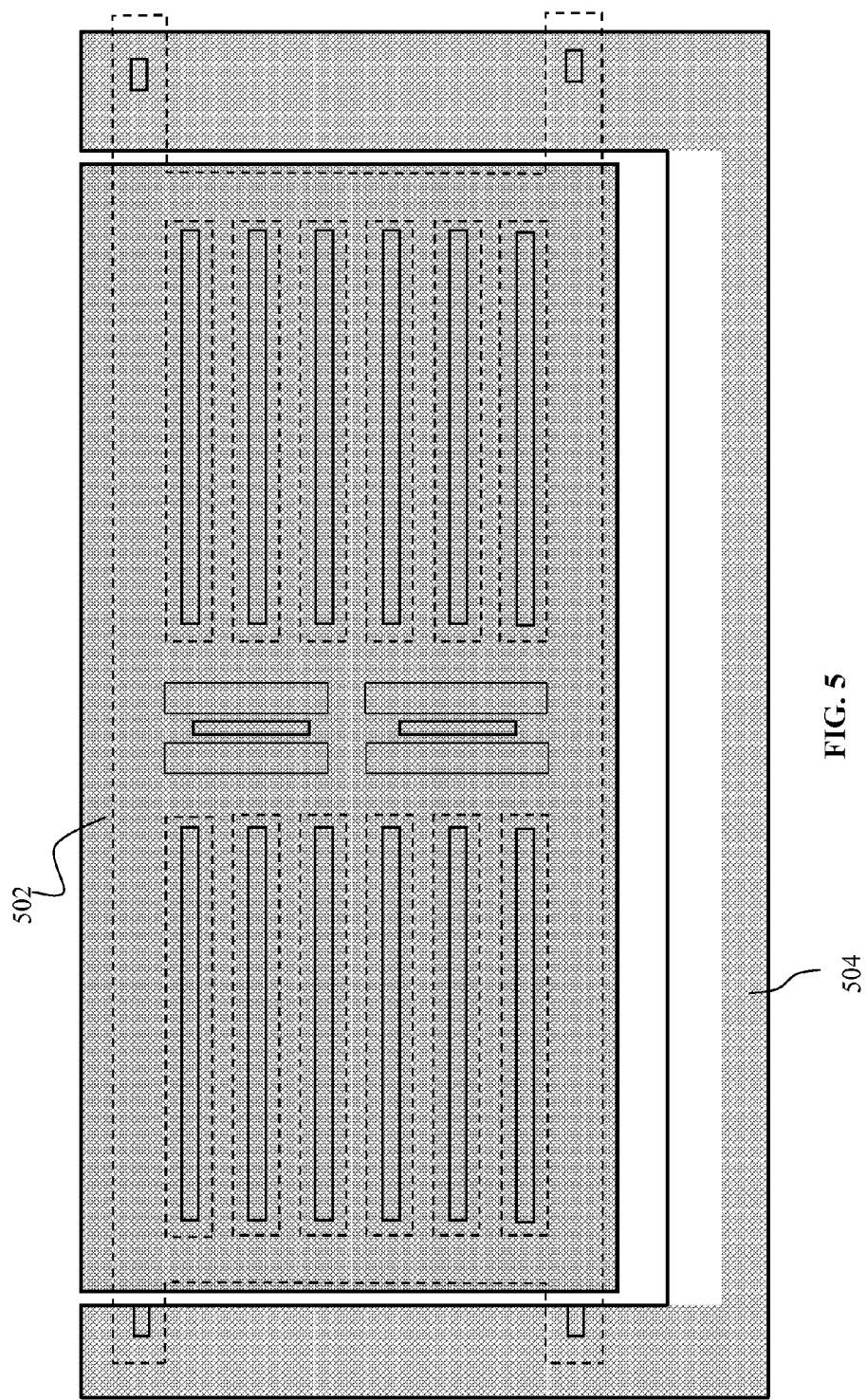
FIG. 5 is a diagram illustrating an example of a fourth mask used in used in the fabrication process for fabricating a shielded gate MOSFET of the type depicted in FIG. 1D.
Figure 6A:
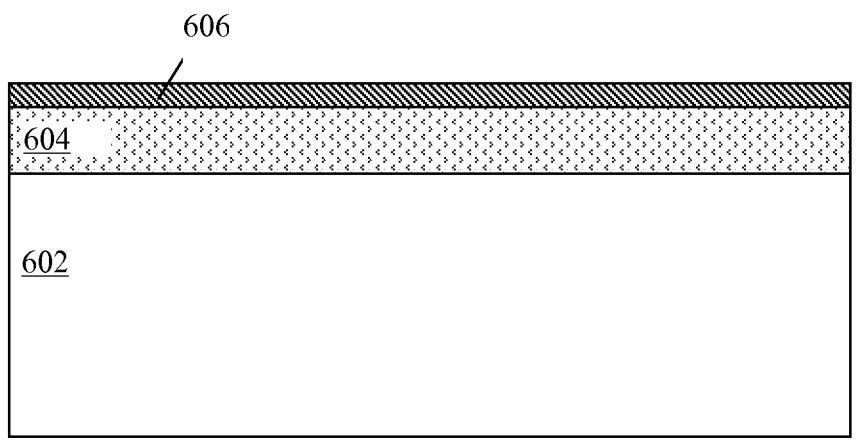
FIGS. 6AA'-32AA' are cross sectional diagrams illustrating the steps of fabrication the shielded gate MOSFET of the type depicted in FIG. 1D along a line AA'.
Figure 6B:
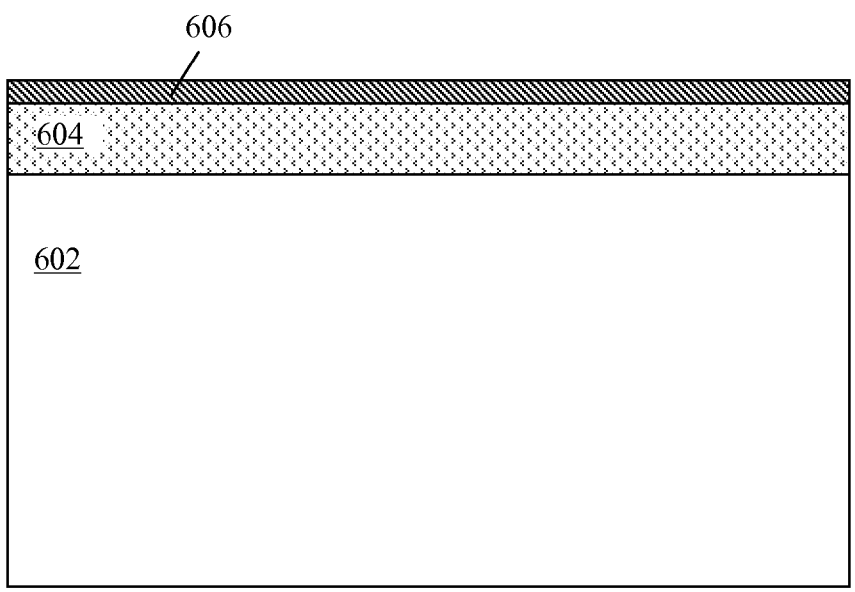
FIGS. 6BB'-32BB' are cross sectional diagrams illustrating the steps of fabrication the shielded gate MOSFET of the type depicted in FIG. 1D along a line BB'.
Figure 6L:
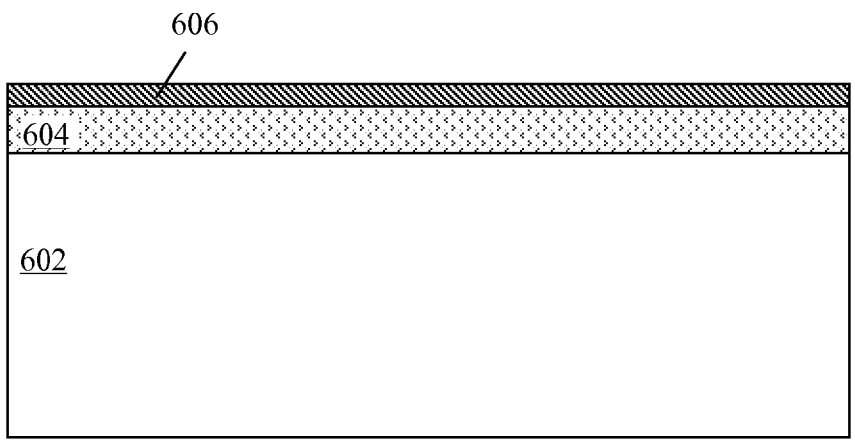
FIGS. 6LL'-32LL' are cross sectional diagrams illustrating the steps of fabrication the shielded gate MOSFET of the type depicted in FIG. 1D along a line LL'.

Fabrication process 150 is discussed in greater detail below in connection with FIGS. 2-5, which illustrate the top views of four masks used in the processes, and FIGS. 6AA'-32AA', 6BB'-32BB', and 6LL'-32LL', which respectively illustrate cross sectional views along lines AA', BB' and LL' of FIG. 1D. AA' line extends across active gate trenches and source/body contacts in an active region, as well as a termination/gate runner trench that terminates the active region and surrounds the active area. BB' line extends along a source pickup contact trench that lies in a termination region between two active regions. LL' line extends through a termination region, and intersects a gate pickup trench (which, in this case, is an extension of the termination/gate runner trench) as well as a gate pickup contact.

In the following discussion, an N type device is described for purposes of illustration. P type devices may be fabricated using a similar process but with opposite conductivity types. In FIGS. 6AA', 6BB' and 6LL', an N type substrate 602 (e.g., an $N^+$ silicon wafer with an $N^-$ epi layer grown on it) is used as the drain of the device. In some embodiments, Epi doping concentration is approximately $3 \times 10^{16}$-$1 \times 10^{17}$ dopants/$cm^3$, with thickness of 2-4 µm, and substrate resistivity of 0.5-3 mohm*cm.

A silicon oxide layer 604 can be formed on the substrate by deposition or thermal oxidation. A nitride layer 606 can then be disposed on top of the silicon oxide layer. In some embodiments, the thickness of the silicon oxide layer is approximately 100~1500 Å, and the thickness of the nitride layer is approximately 1500 Å.

Figure 2:
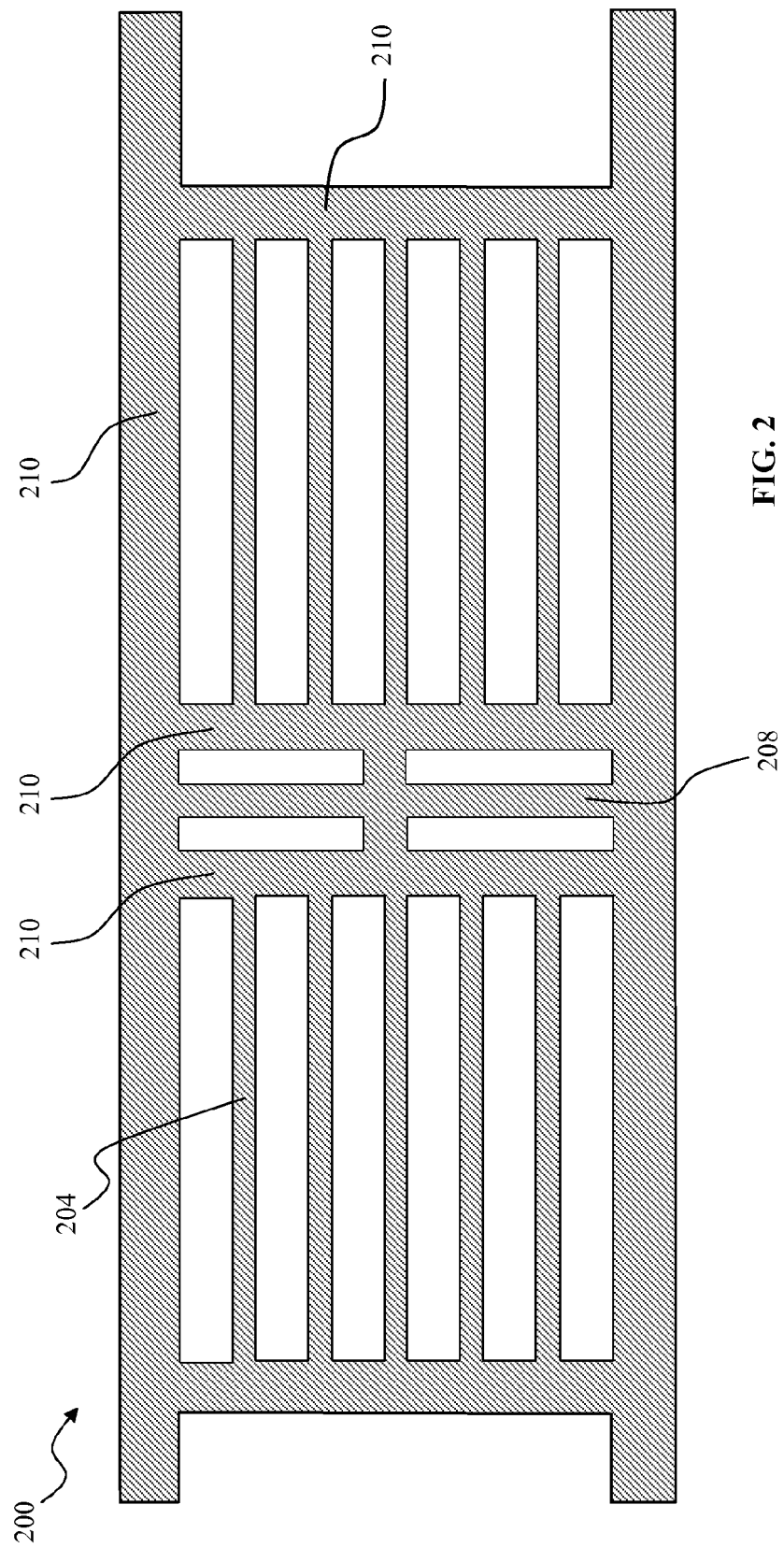
FIG. 2 is a diagram illustrating an example of a first mask used in the fabrication process for fabricating a shielded gate MOSFET of the type depicted in FIG. 1D.

A photo resist (PR) layer 700 is then applied on top of the nitride layer and patterned using a first mask. FIG. 2 is a diagram illustrating the top view of an example of a first mask, also referred to as the trench mask. Trench mask 200 is used to pattern the PR layer. The PR areas corresponding to the shaded areas of the mask are removed, and the PR areas corresponding to the un-shaded areas of the mask remain when the resist is developed. The trench mask defines active gate trenches 204, source pickup trenches such as 208, and gate runner/termination trenches such as 210. The source pickup trenches 208 are formed in between active regions containing the active gate trenches 204. In the example shown, different types of trenches have different widths: the active gate trenches are the narrowest, the source poly pickup trenches are medium width, and the gate runner/termination trenches are the widest. In some embodiments, the widths of the active gate trenches, the source pickup trenches, and the gate runner/termination trenches may be approximately 0.6 µm, 1.0 µm, and 2.0 µm, respectively. Low grade masks such as masks with critical dimension of 0.35 µm can be used to fabricate the device therefore reducing the cost of masks required. The source/body active cell contacts are self-aligned without a mask. The gate and source poly contacts are made in trenches with relatively large dimensions. The alignment of the second mask is much less critical with the improvements of embodiments of this invention as explained later.

Figure 7A:
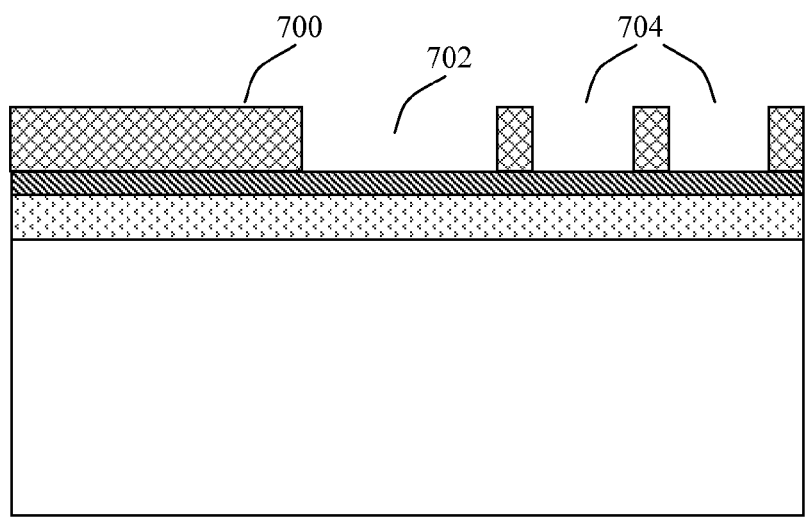
Figure 7B:
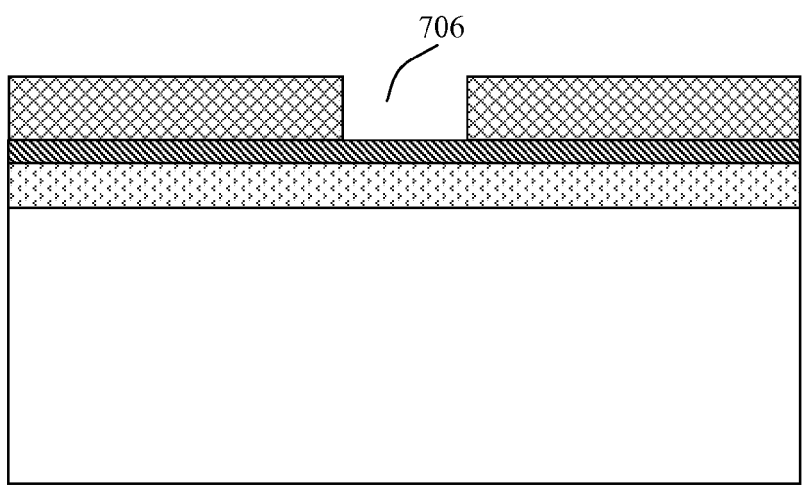
Figure 7L:
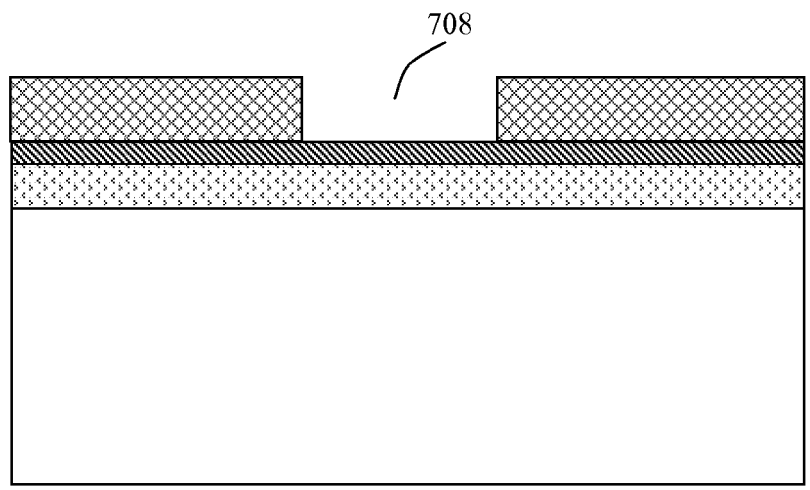

In FIG. 7AA', in the AA' cross section, the residual PR layer 700 forms a termination trench opening 702 and active gate trench openings 704. In FIG. 7BB', in the BB' cross section, the residual PR layer 700 forms source poly pickup contact trench opening 706. In FIG. 7LL', in the LL' cross section, the residual PR layer forms gate pickup contact trench opening 708.

Figure 8A:
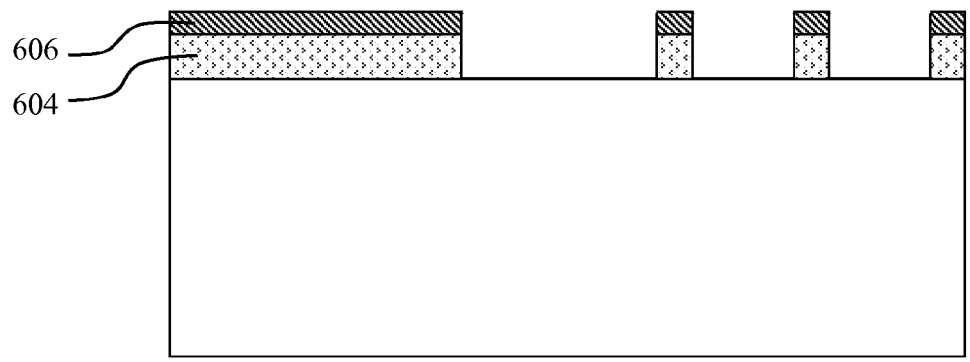
Figure 8B:
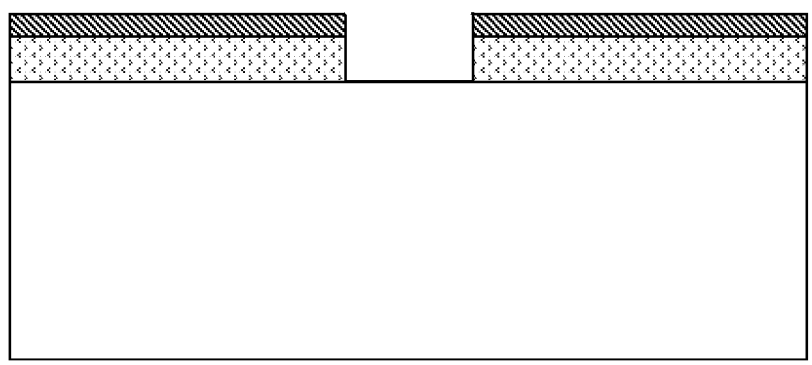
Figure 8L:
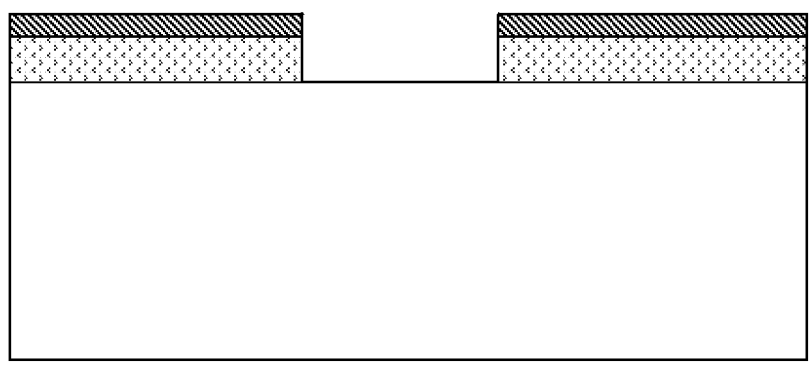

Next, a hard mask (HM) etch is performed to etch away exposed portions of the nitride layer 606 and silicon oxide layer 604. The etching stops at the silicon surface. The remaining PR 700 is then removed, as shown in FIGS. 8AA', 8BB', and 8LL'. The remaining portions of oxide 604 and nitride 606 act as a hard mask for subsequent steps.

Figure 9A:
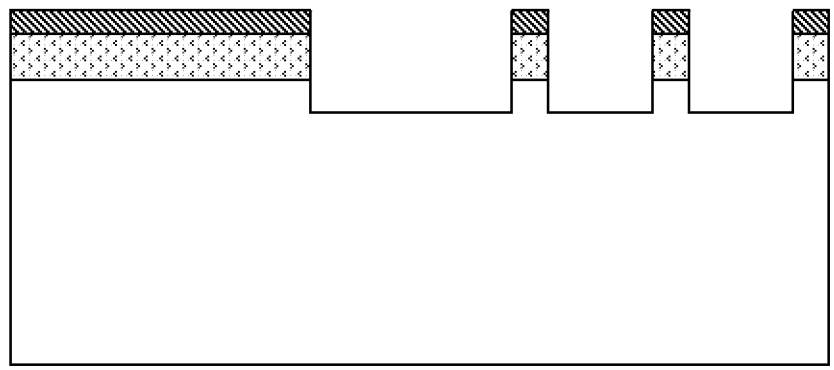
Figure 9B:
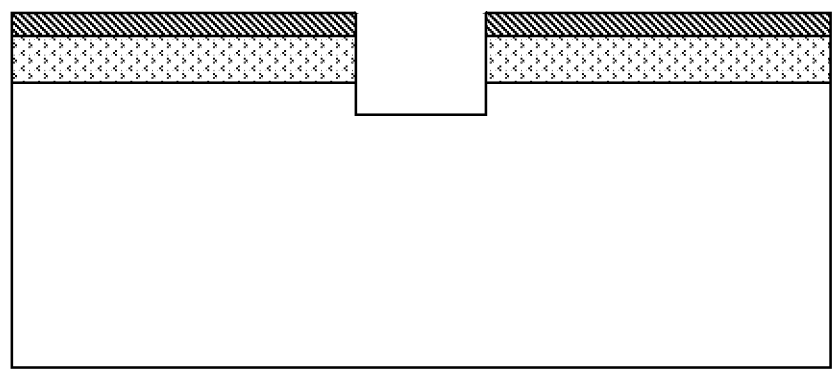
Figure 9L:
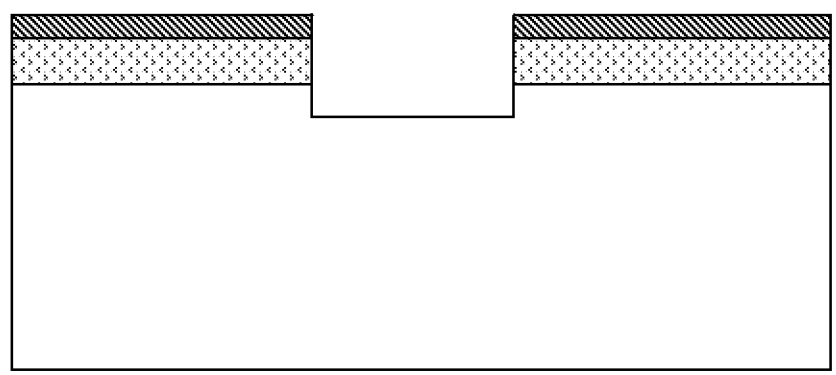
Figure 10A:
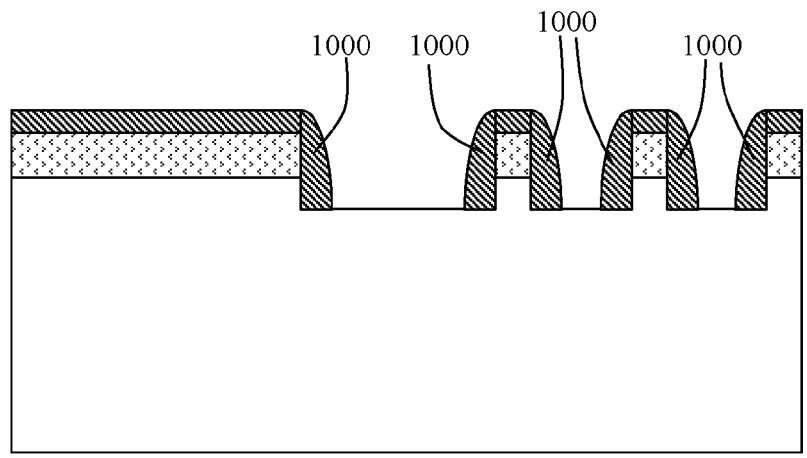
Figure 10B:
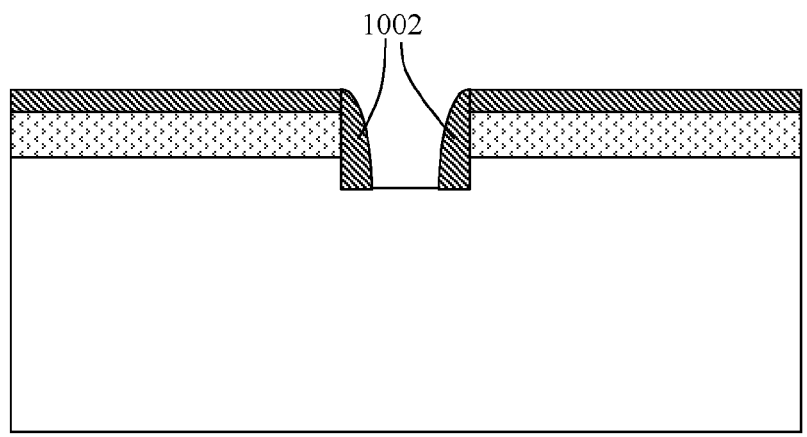
Figure 10L:
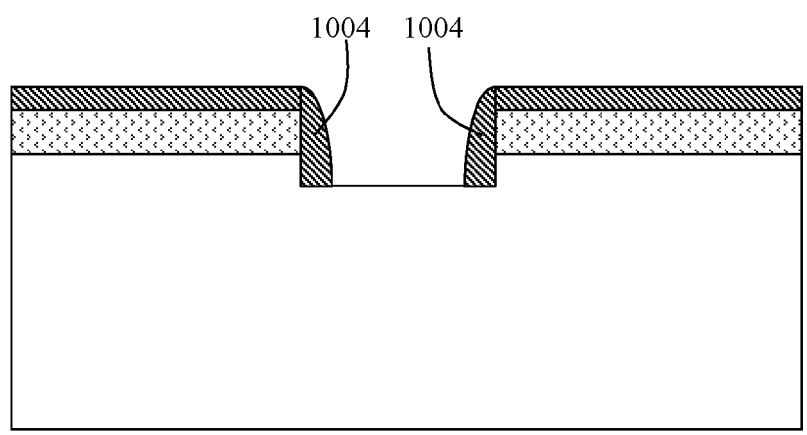

In FIGS. 9AA', 9BB', and 9LL', the trench openings are etched into the semiconductor substrate 602. In some embodiments, the target depth of the trenches is approximately 0.3 µm~0.5 µm. A thin layer of oxide can optionally be deposited or grown thermally in the trench openings, lining both the trench bottom and the trench walls. The oxide layer can be approximately 200 Å thick in some embodiments. Once the oxide is formed, an additional layer of nitride is deposited and anisotropically etched back along the horizontal surface. In some embodiments, the thickness of the nitride layer is approximately 2200 Å. Nitride spacers (aka trench spacers) 1000, 1002, 1004 are thus formed along the trench walls after blanket anisotropic etch back, as shown in FIGS. 10AA', 10BB', and 10LL'

Figure 11A:
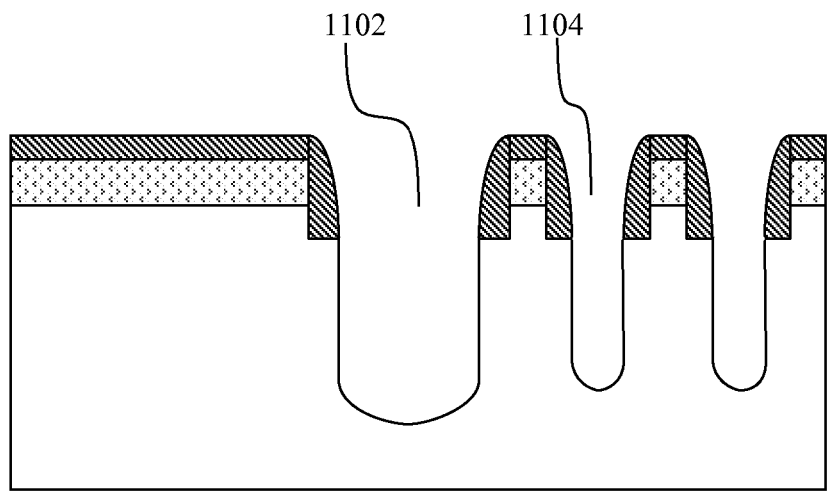
Figure 11B:
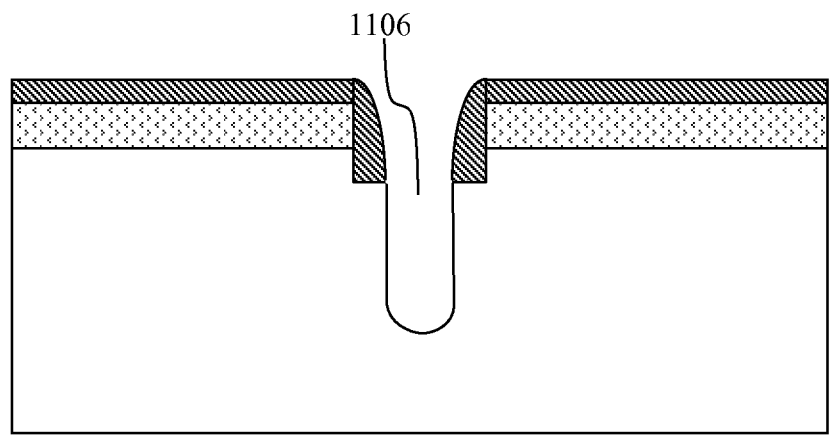
Figure 11L:
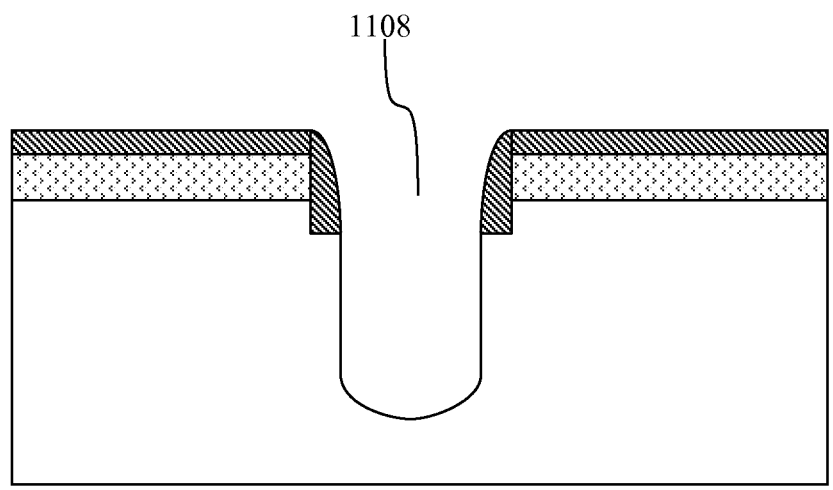

Next, any exposed liner oxide layer in the bottom of the trench opening is removed and a blanket silicon etch step is performed to further deepen the trenches in FIGS. 11AA', 11BB' and 11LL'. The resulting trench depth is on the order of approximately 1.5 µm~2.5 µm depending on device application, and the trench walls are sloped at an angle of approximately 87°~88°. The nitride spacers allow for a self-aligned etching step that does not require additional mask. As will be shown later in the process, the nitride spacers preserve a semiconductor mesa area until a self-aligned active cell contact can be formed. The nitride spacer also performs other benefits such as allowing a polycide to be formed on the gate poly. A wider trench opening results in a deeper trench than a narrower trench opening due to the nature of the silicon etch loading factor. For example, since gate runner/termination trench opening 702 is wider than active gate trench opening 704, the resulting gate runner trench 1102 is deeper than active gate trench 1104, as shown in FIG. 11AA'. A source pickup trench 1106 may be formed deeper than the active gate trench 1104, but not as deep (nor wide) as the termination/gate runner trench 1102. Like the gate runner trench 1102, the gate pickup trench 1108 is also relatively wide and deep. The depth of the trenches may range from a few hundred angstroms to a few microns. Round hole (R/H) etch ranging from 250 Å~500 Å can be performed to make the corners of the trenches smoother to prevent high electric fields due to sharp corners.

Figure 12A:
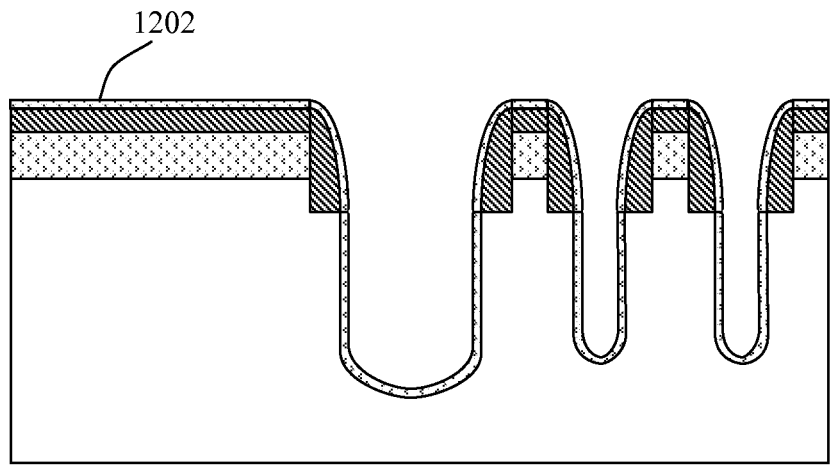
Figure 12B:
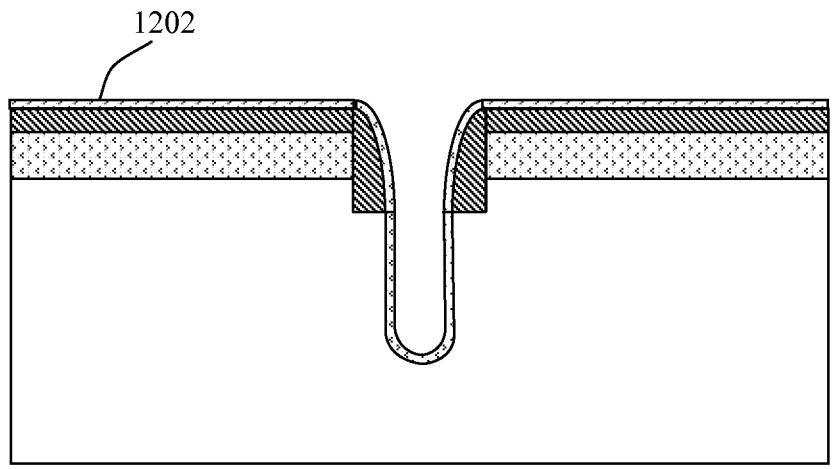
Figure 12L:
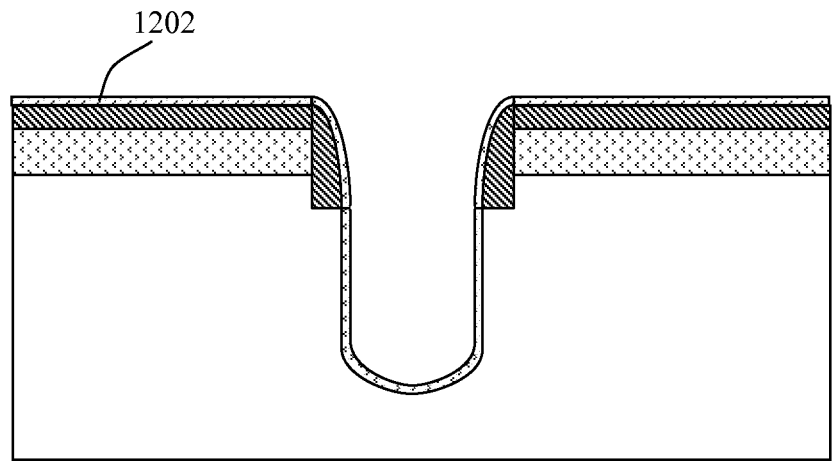

In FIGS. 12AA' 12BB' and 12LL', one or more oxide layers 1202 are deposited or thermally grown. In some embodiments, a sacrificial oxide layer of approximately 500 Å is optionally grown and removed to improve the silicon surface. A layer of oxide of approximately 250 Å is grown, followed by forming a layer of high temperature oxide (HTO) of approximately 900 Å. For a higher voltage device, the oxide layer 1202 may be thicker e.g. 1000 to 5000 Å.

Figure 13A:
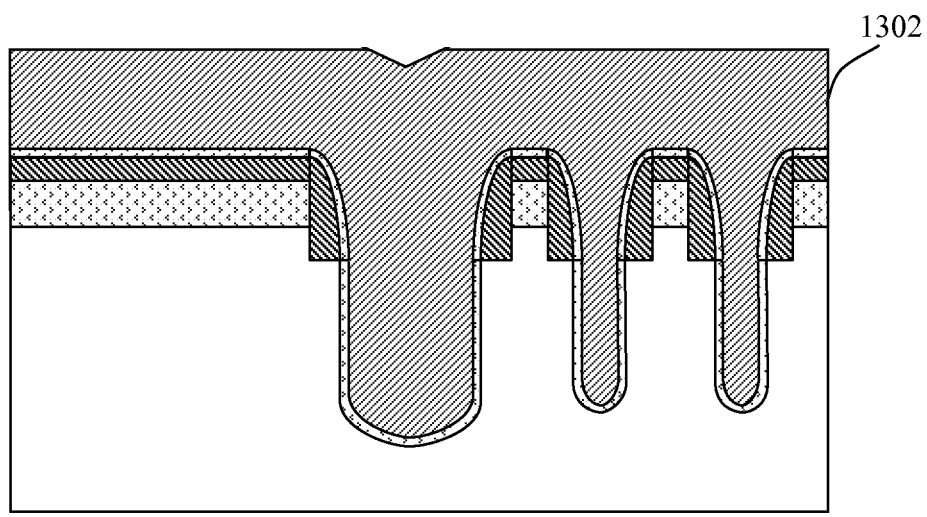
Figure 13B:
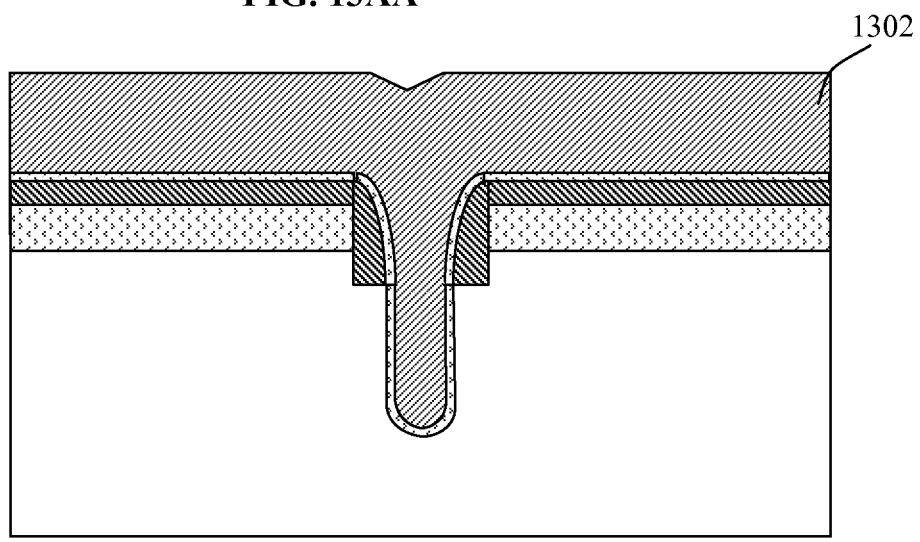
Figure 13L:
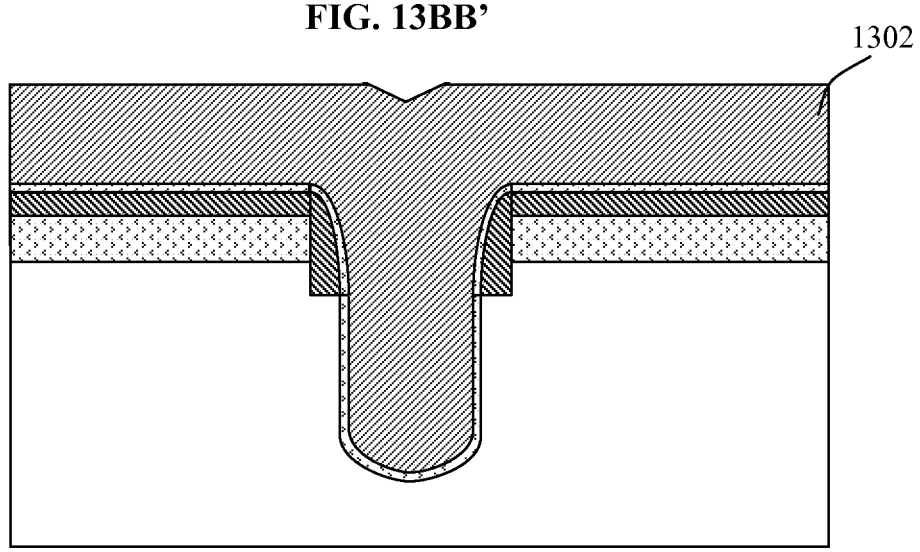

Conductive material, such as polysilicon (poly) 1302 can be deposited, as shown in FIGS. 13AA', 13BB' and 13LL'. In some embodiments, the thickness of the conductive material can be approximately 12000 Å, which is greater than half the width of the widest trench. Thus, conductive material layers on the sidewalls merge and completely fill all the trenches. This layer of conductive material is sometimes referred to as source poly, shield poly, or poly 1.

Figure 36A:
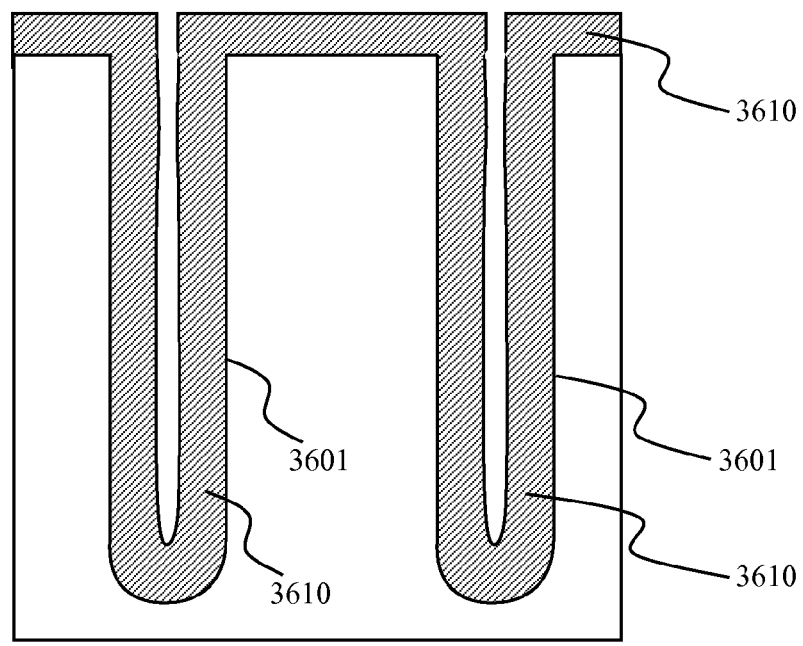
FIGS. 36A-36C are cross sectional diagrams illustrating a dep-etch-dep (deposit-etch-deposit) technique for filling of high aspect ratio trenches with conductive material in conjunction with an embodiment of the present invention.
Figure 36B:
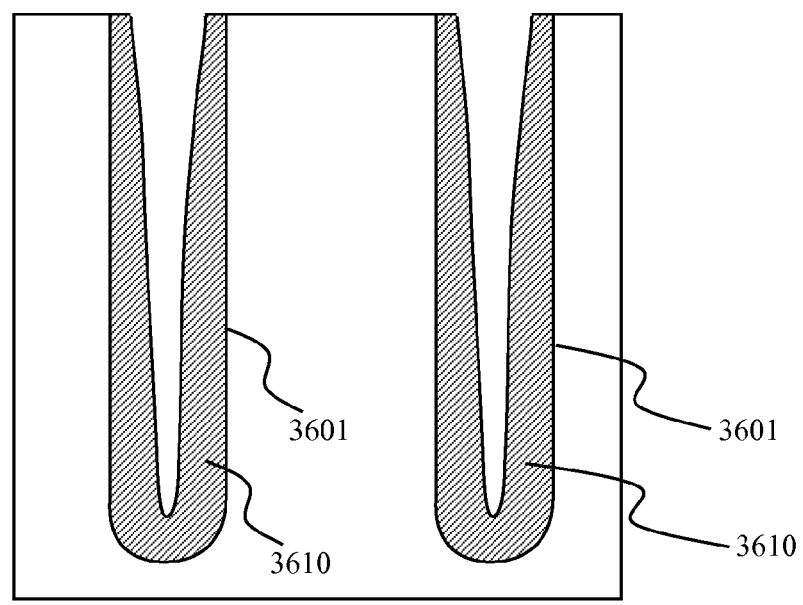
Figure 36C:
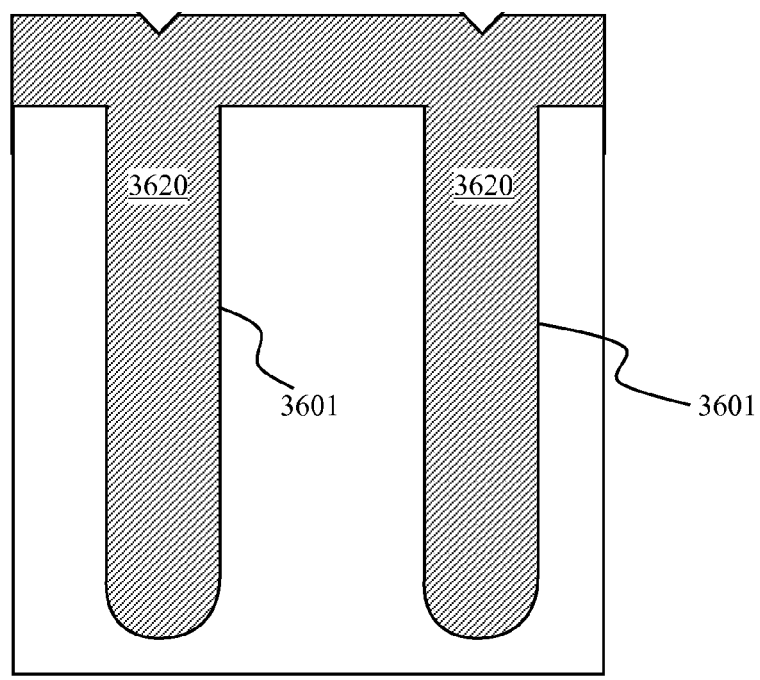

As noted above, if the trenches are high aspect ratio (e.g., about 10:1 or greater), there is problem with formation of voids during filling with the conductive material. In alternative embodiments of the present invention this problem can be overcome through use of a trench fill technique referred to herein as dep-etch-dep (deposit-etch-deposit). In this technique, as shown in FIG. 36A, the trench 3601 is first partially filled with conductive material (e.g., polysilicon) 3610, e.g., by a chemical vapor deposition (CVD) process. The partial fill may coat the conductive material 3610 on the bottoms and sidewalls of the trench. Note that the aspect ratio of the remaining gap in the trench 3601 is now higher than before, making the rest of the trench more difficult to fill. Due to the nature of the fill process, a bottle neck may start to form near the top of the trench, which will lead to voids forming if the fill process is continued as is. The partial fill is then followed by a partial etch back that removes some of the conductive material from the top of the trench, and makes the remaining gap in the trench 3601 less steep as seen in FIG. 36B. The partial etch back is preferably a dry etch (typically anisotropic). Such an etch can form a spacer-like profile that allows the follow up second film deposition be performed without forming a seam or voids. Selectivity between oxide and poly is very high, typically as high as 15~30:1. After the partial etch back, a second deposition of conductive material can then be performed (e.g., CVD of polysilicon) to fill the remaining portion of the trench with the same or different material as the first deposition. As can be seen from FIG. 36C, the dep-etch-dep technique can completely fill a high aspect ratio trench 3601 with a conductive material (e.g., polysilicon) 3620 without leaving a void.

It is noted that the dep-etch-dep fill technique for high aspect ratio trenches can also be applied to fabrication of MOS devices in accordance with the method set forth in U.S. patent application Ser. No. 12/583,192, or to other applications.

Figure 14A:
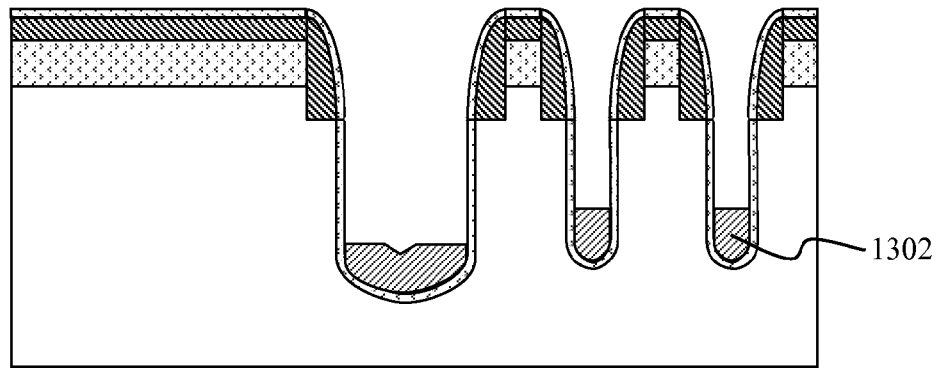
Figure 14B:
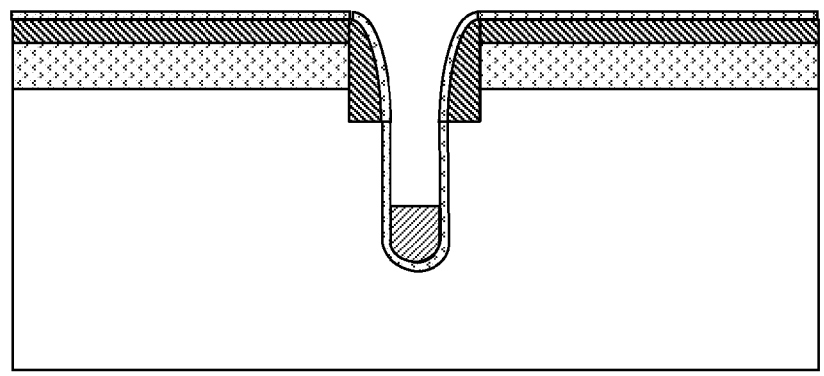
Figure 14L:
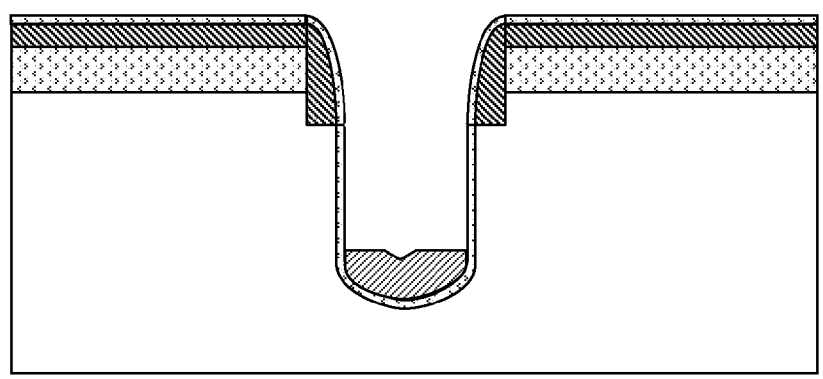

The conductive material 1302 is then etched back using a dry etch, as shown in FIGS. 14AA', 14BB' and 14LL'. In this example, in the active gate trenches, the remaining conductive material 1302 has a thickness of approximately 6000 Å.

Figure 15A:
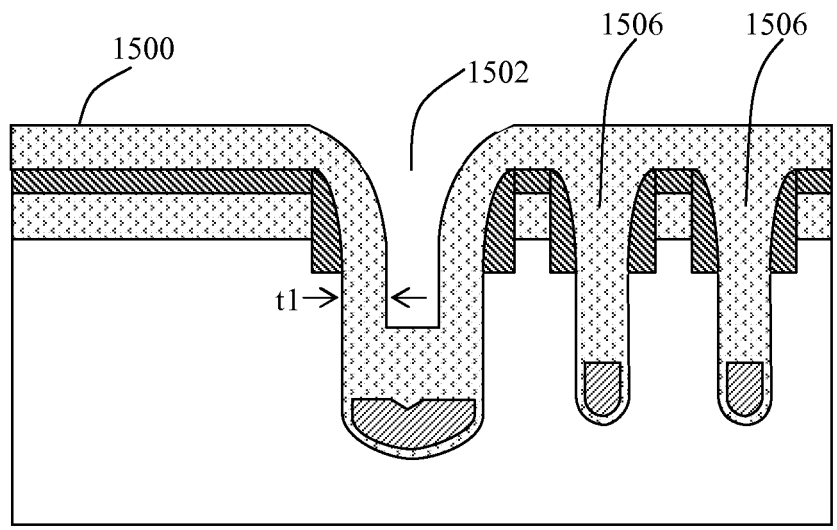
Figure 15B:
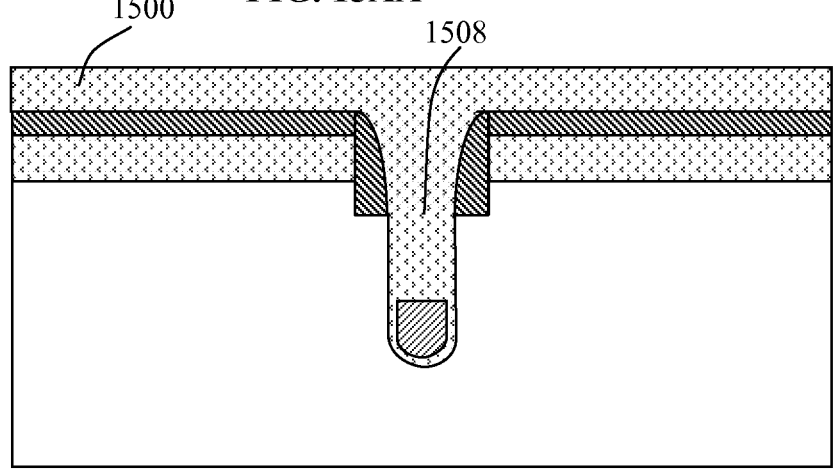
Figure 15L:
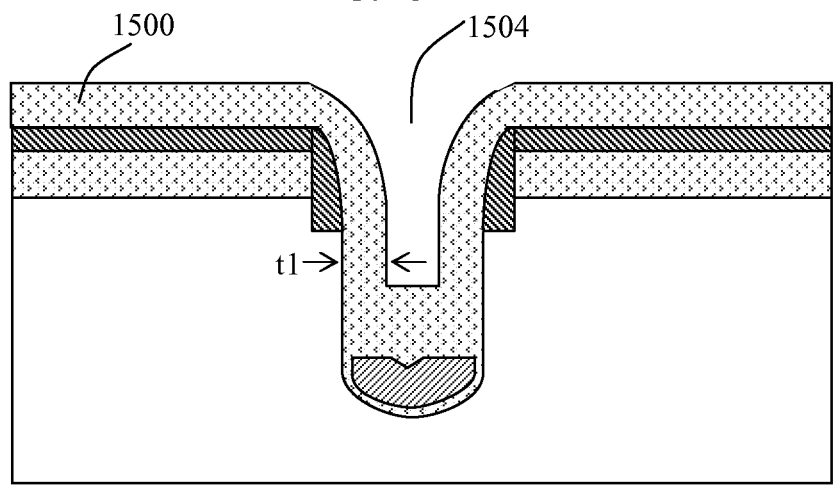

High density plasma (HDP) oxide 1500 is then deposited and densified. In some embodiments, the densification takes place at a temperature of approximately 1150° C. and lasts for approximately 30 seconds. The oxide on the trench sidewalls has a substantially uniform thickness (labeled as t1 in FIGS. 15AA', 15BB' and 15LL') throughout the device. In some embodiments, t1 is approximately ranging from 2000 Å~4000 Å to completely fill only the narrower trenches (such as active gate trenches and source poly pickup trenches), but partially fill the wider trenches such as gate runner trench 1502 and gate pickup trench 1504. Thus, the wider trenches are not completely filled, allowing a gate poly to be disposed in the space not completely filled by the HDP oxide in such wider trenches in a later step. In narrower trenches such as active trenches 1506 and the source pickup trench 1508, the thickness of the oxide layer t1 is greater than half the width of the trench, and thus the oxide linings merge and completely fill the trench. A later mask can be used to etch out space for a gate poly in the active gate trenches 1506, while keeping the source pickup trench 1508 filled with oxide 1500, as will be shown later.

Figure 16A:
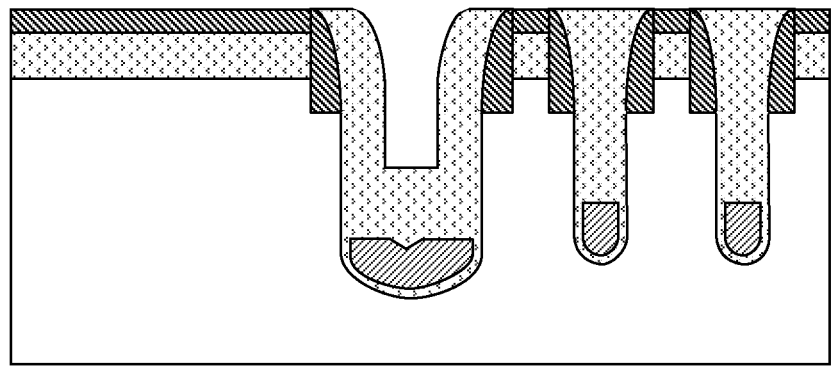
Figure 16B:
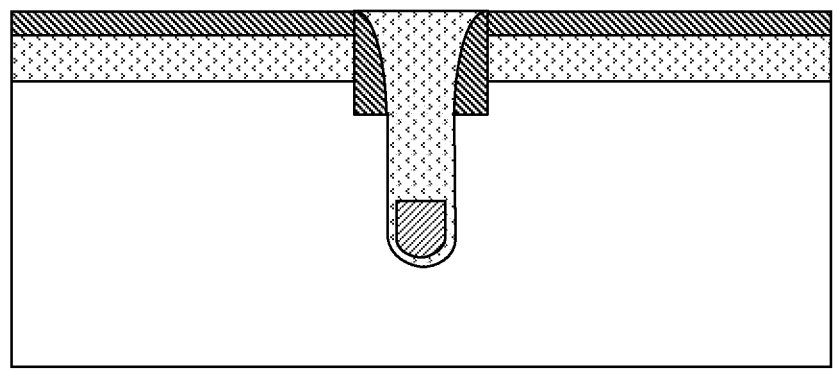
Figure 16L:
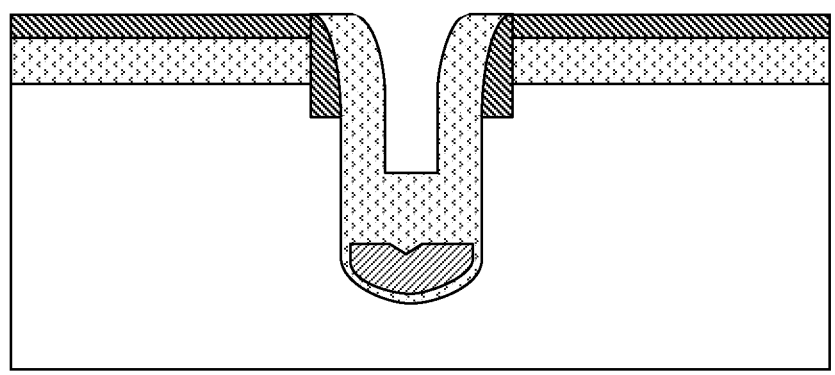

Oxide chemical mechanical polish (CMP) is performed. As shown in FIGS. 16AA', 16BB' and 16LL', the CMP process is used to polish the oxide until the top surface of the oxide is even with the nitride surface, which serves as an etch stop.

Figure 17A:
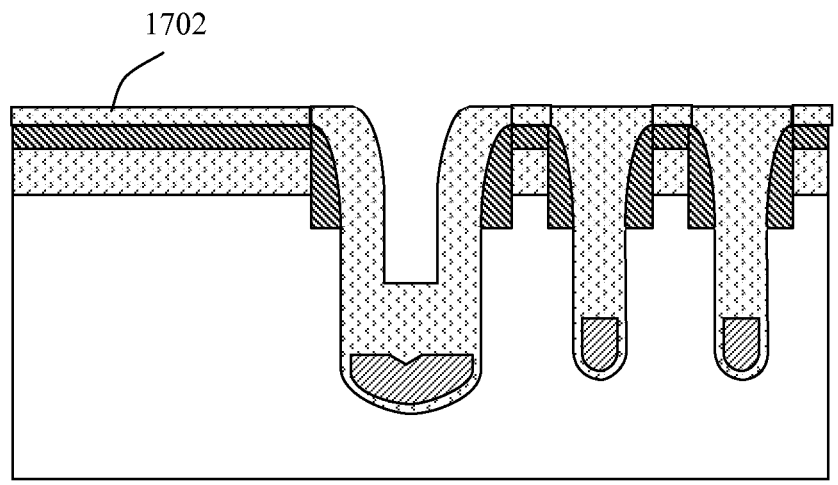
Figure 17B:
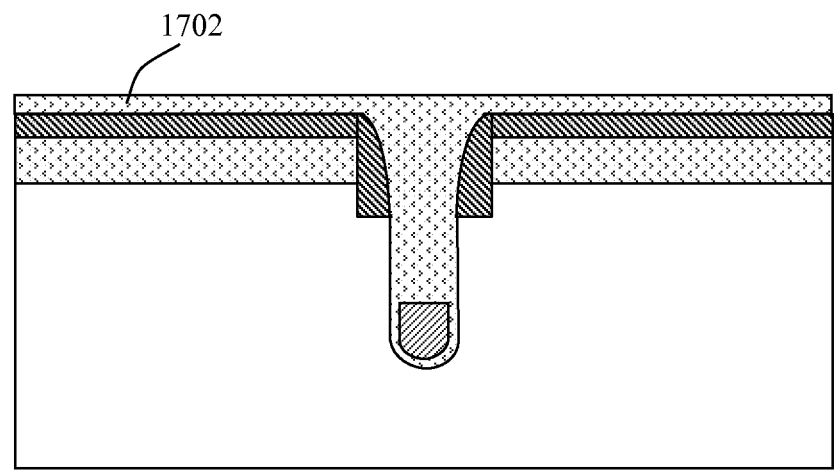
Figure 17L:
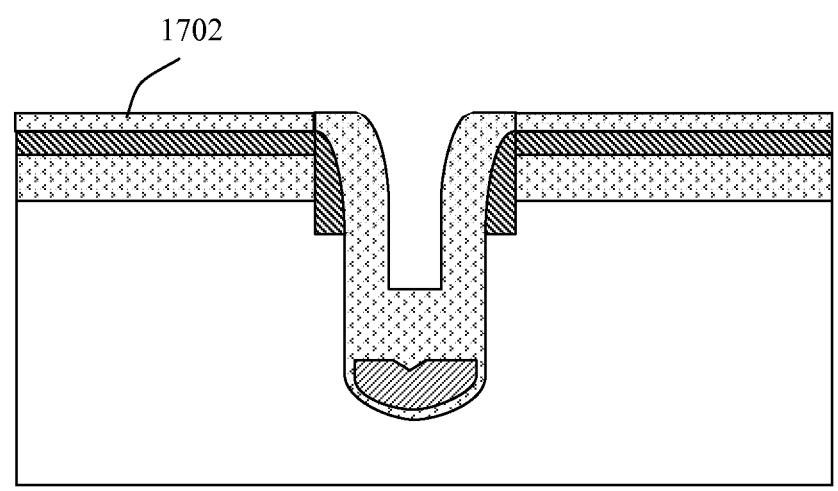

FIGS. 17AA', 17BB' and 17LL' show that another layer of oxide 1702 is added. The thickness of the oxide layer is approximately 1000 Å~2000 Å in some embodiments. The thickness of this oxide controls the degree of undercut of wet etching under the second mask (next step). This oxide film also protects the nitride in all the non-active area of the device. The protected nitride allows maskless blanket etching of the silicon later.

Figure 3:
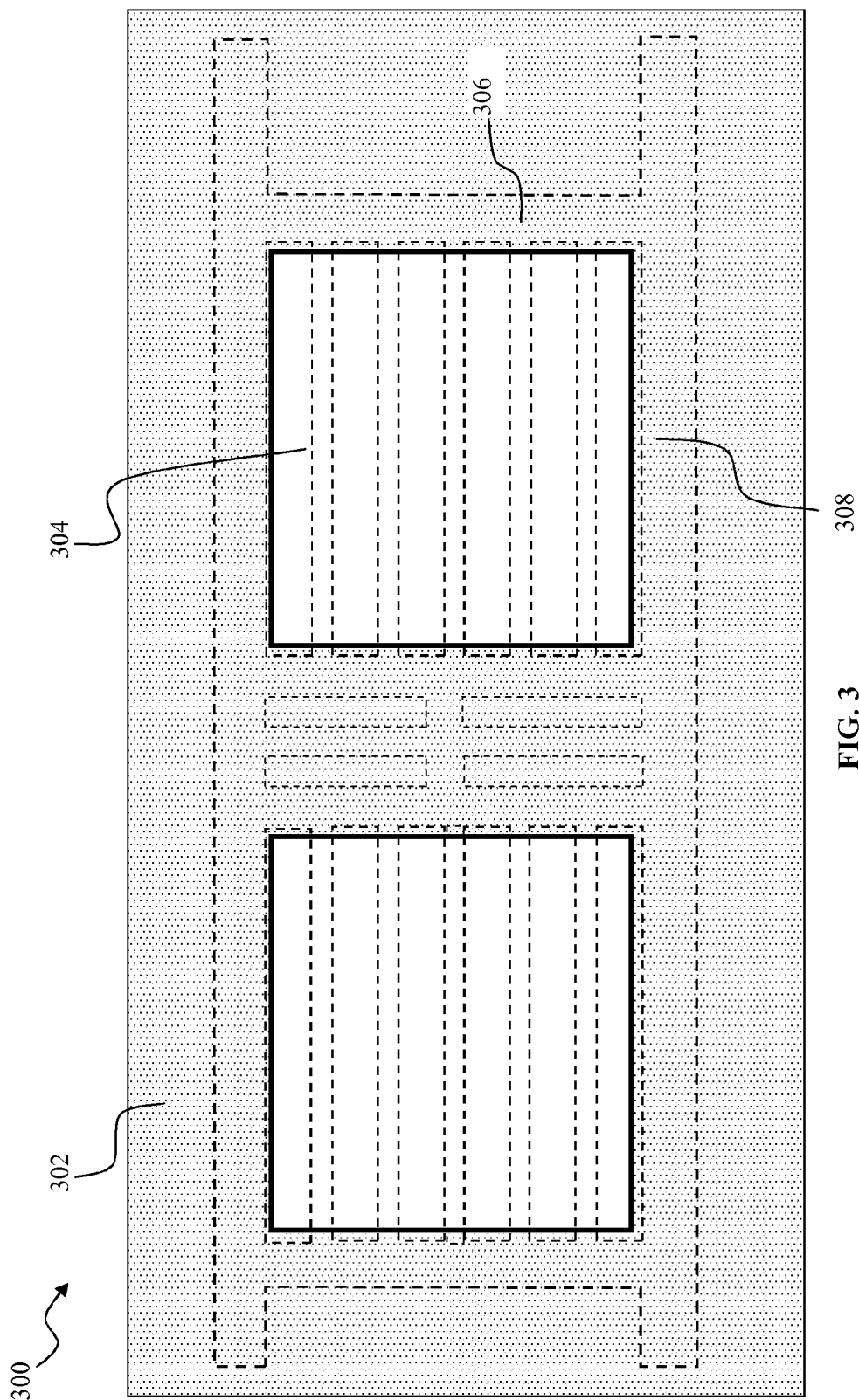
FIG. 3 is a diagram illustrating an example of a second mask used in used in the fabrication process for fabricating a shielded gate MOSFET of the type depicted in FIG. 1D.

A layer of photo resist 1800 is then spun on the surface of the structure and a second mask is applied. FIG. 3 is a diagram illustrating the top view of an example of a second mask 300. The outline of the previous mask, the trench mask, is shown in dashed lines. The outline of the second mask, also referred to as the poly cover mask, is shown in solid lines. The second mask is used to facilitate the formation of an intermediate dielectric region and a termination protection region. PR in area 302 (shaded area) of the second mask remains, thus covering the areas underneath and protecting those areas from oxide wet etching. PR in areas such as 304 (un-shaded areas) of the mask is removed. Areas not covered by PR are etched in the next steps. The active MOSFET cells are formed within openings such as 304. As will be described in greater detail below, the edges of the openings are placed close to termination trenches such as 306 and 308 to facilitate asymmetric etching of these trenches.

Figure 18A:
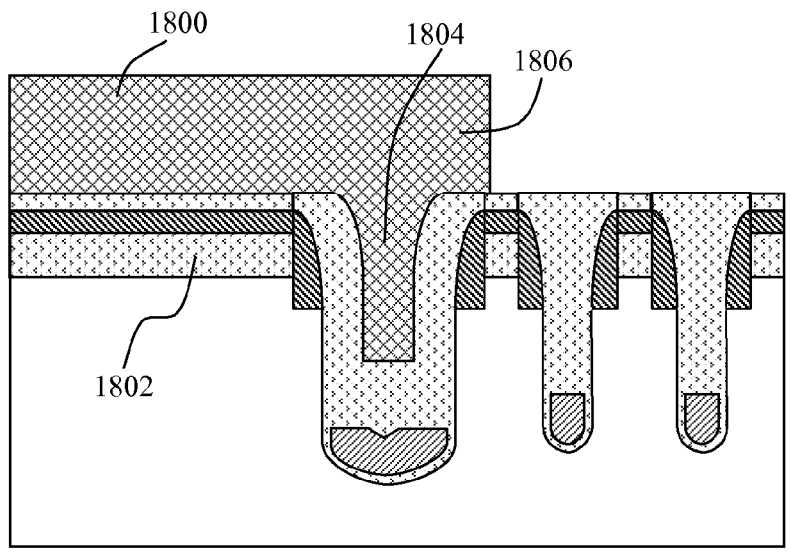
Figure 18B:
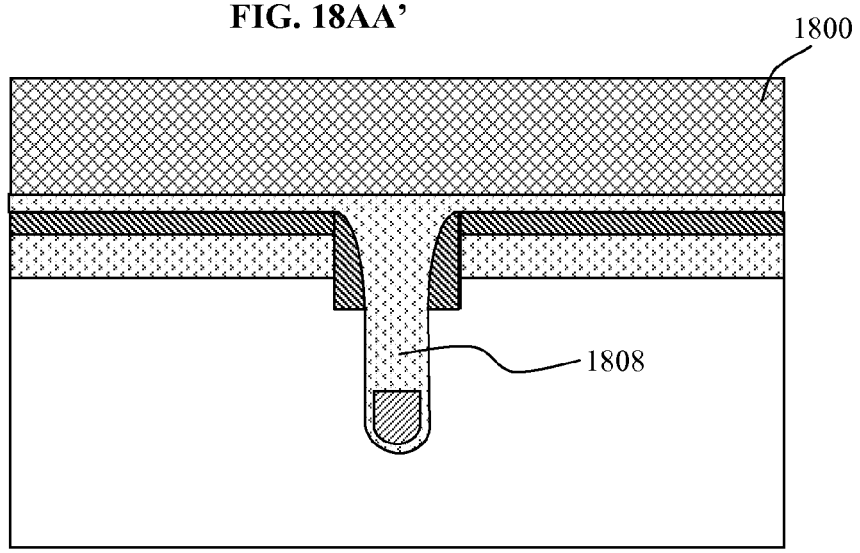
Figure 18L:
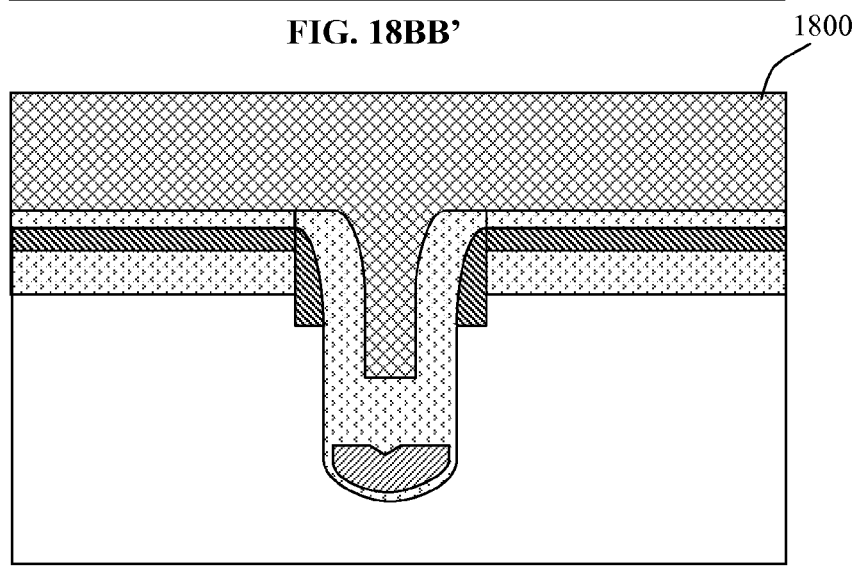

FIGS. 18AA', 18BB' and 18LL' show the pattern of the PR cover after the exposed portions have been removed. In FIG. 18AA', the PR cover in the AA' cross sectional area extends into termination region at 1802, fills termination trench at 1804, and extends over into the active area at 1806. As will be shown in connection with FIG. 19AA' below, a portion of the oxide under the PR will be removed by etching. Mask overlap and wet etch undercut together help determine the final profile. Thus, the distance of the PR cover 1800 extending into the active region in part determines in part how much oxide will be removed by etching. Other factors include etch time and the thickness of the oxide layers. The oxide undercut depth ranges from 0.6 μm~1.5 μm. In FIG. 18BB', the PR cover 1800 shields source poly pickup trench 1808 from being etched. In FIG. 18LL', the gate pickup contact trench and its adjacent areas are also covered by PR 1800.

Oxide wet etch is then performed. The results are illustrated in FIGS. 19AA', 19BB' and 19LL'. Some oxide in areas unmasked by PR is removed, such that the remaining oxide is held at desired height. Some oxide near the edges of the PR is also removed. In FIG. 19AA', a portion of oxide in gate runner trench 1902, located adjacent to the PR edge is removed. The amount of oxide that is etched can be controlled by adjusting the position of edge 1904 of PR layer and the etch time. Extending edge 1904 further into the active region would result in less oxide being etched, and pulling the edge further away from the active region would have the opposite effect. The amount of oxide etched away can vary in different embodiments. In the example shown, enough oxide is etched away such that the remaining oxide lining the trench wall in the vertical direction is approximately uniform in thickness. The oxide layer above the conductive material in the trenches, such as oxide layers 1906 and 1908, is referred to as the intermediate dielectric or inter-poly dielectric (IPD). The oxide covering the termination region is sometimes referred to herein as the termination protection region. In particular, oxide layer 1910 covering the termination/gate runner trenches 1102 is part of the termination protection region. The intermediate dielectric can range from a few hundred to a few thousand angstroms in thickness.

Figure 20A:
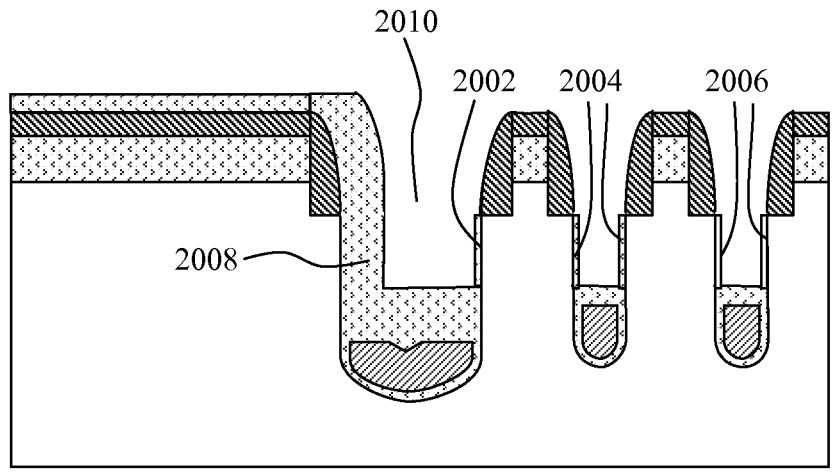
Figure 20B:
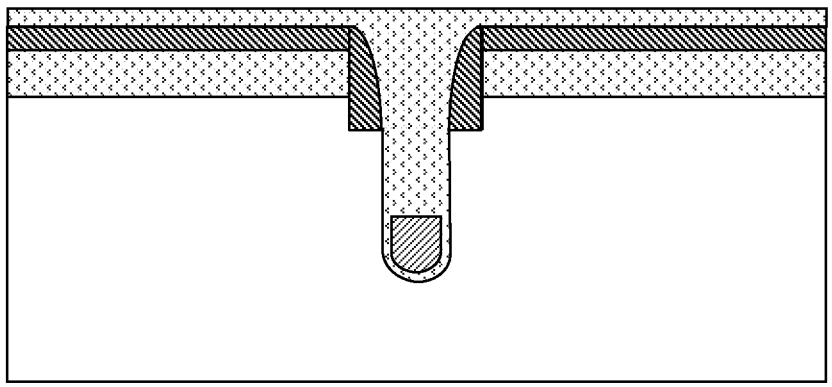
Figure 20L:
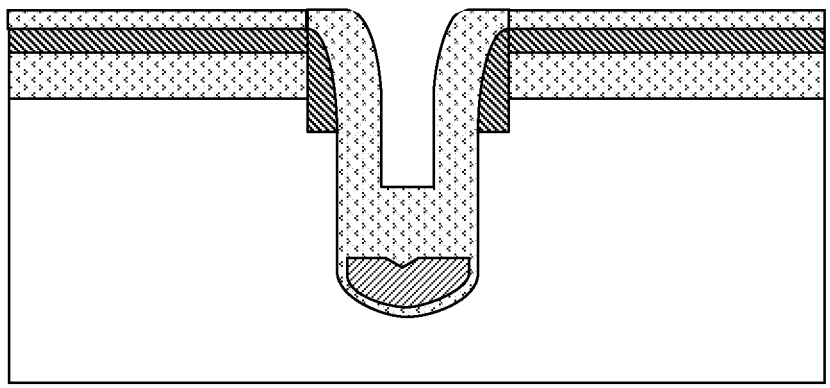

The PR is then removed, and a layer of gate oxide is deposited or thermally grown. In some embodiments, the added oxide layer is approximately 450 Å thick. Thus, in FIG. 20AA', gate oxides 2002, 2004, 2006, and 2008 are formed on the exposed trench walls. Termination trench 2010 has asymmetric sidewalls, with a thick oxide 2008 on the termination area side, and a thin oxide 2002 on the active area side.

Figure 21A:
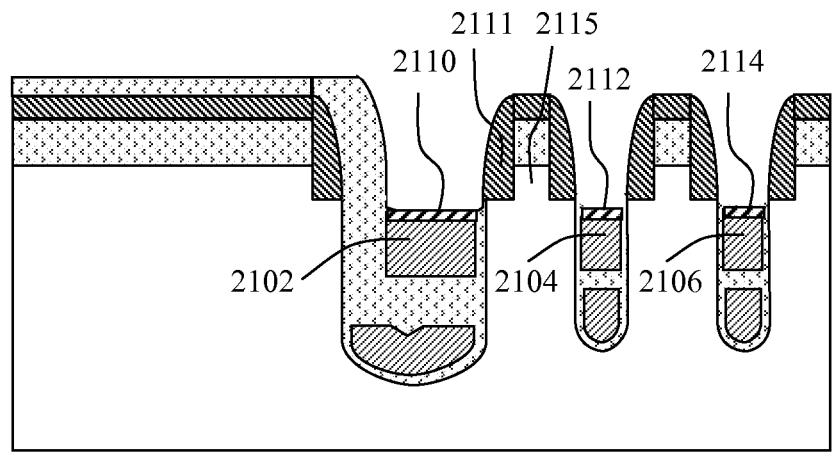
Figure 21B:
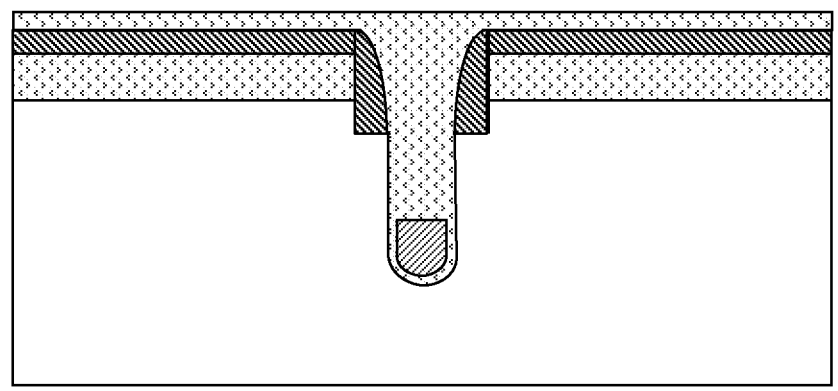
Figure 21L:
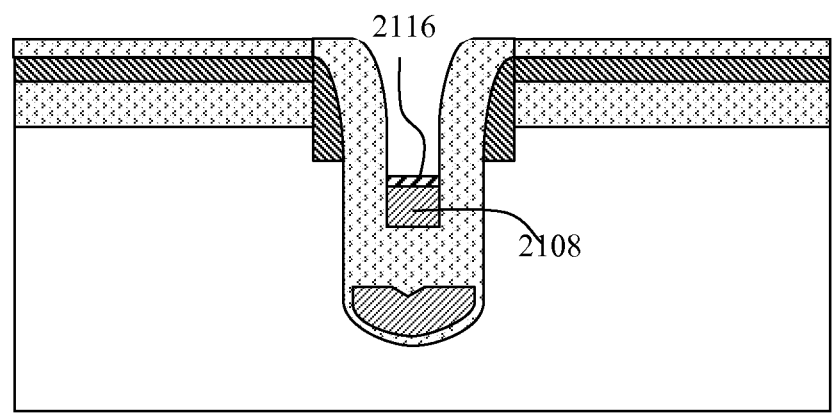

Another conductive material (e.g., polysilicon) deposition and etch back is performed. By way of example, and not by way of limitation, as seen in FIGS. 21AA' and 21LL', approximately 8000 Å~12000 Å of polysilicon can be deposited in various trenches. The deposited poly is etched back, forming gate poly such as 2102, 2104, 2106, and 2108. In the example shown, the poly surface is approximately 500-1000 Å below nitride spacer bottom reference level. A layer of metal such as titanium or cobalt can be deposited and annealed. Where the metal is in contact with the poly, a polycide layer is formed. The titanium or cobalt metal over the oxide or nitride does not form silicide and is removed. As shown, polycide is formed at 2110, 2112, 2114, and 2116 on top of gate poly electrodes. The nitride spacers 2111 help keep silicide from being formed on the semiconductor mesas 2115.

Figure 22A:
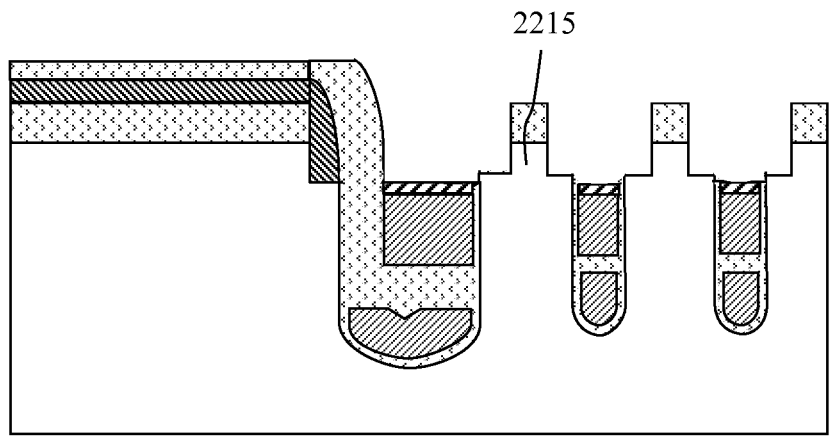
Figure 22B:
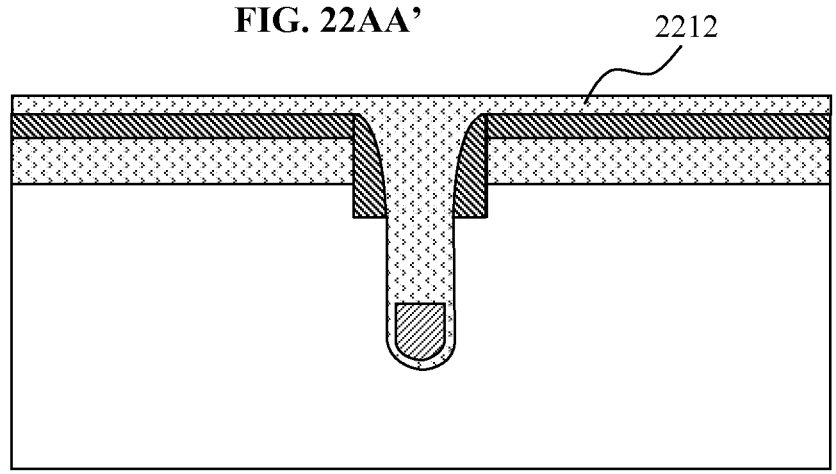
Figure 22L:
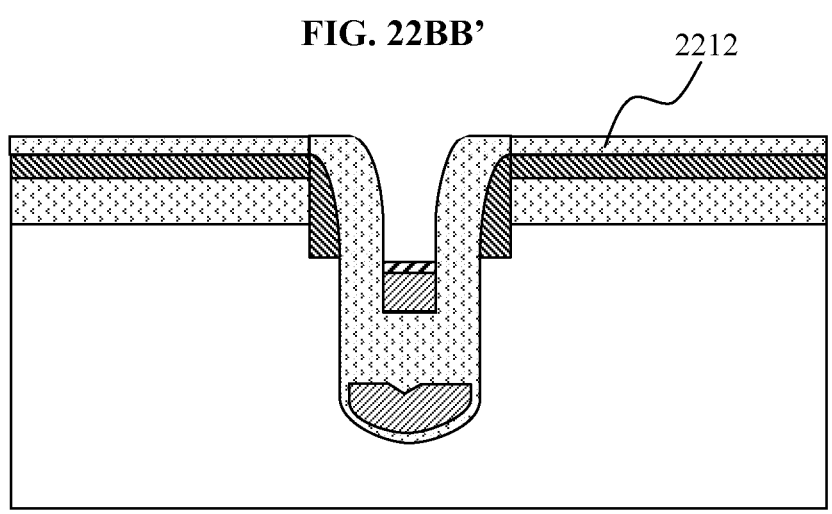

In FIG. 22AA', exposed nitride spacers in the runner gate trench and the active gate trenches are removed through a wet etch process. The nitride spacers have protected the active cell semiconductor mesas 2215 up to this point. In FIGS. 22BB' and 22LL', the shown nitride layers and nitride spacers are protected by oxide layer an oxide layer 2212.

Figure 23A:
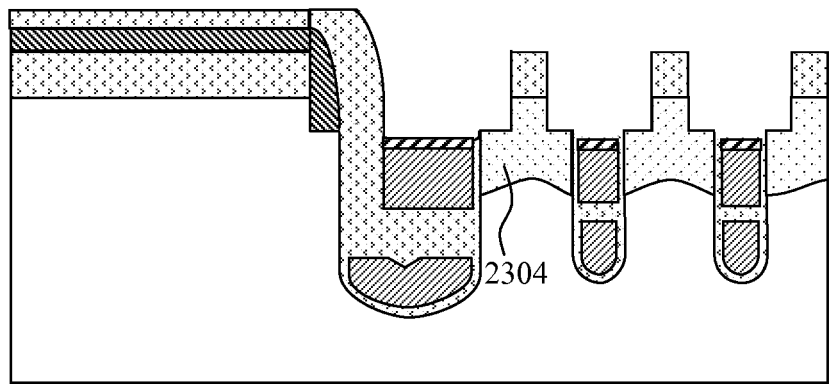
Figure 23B:
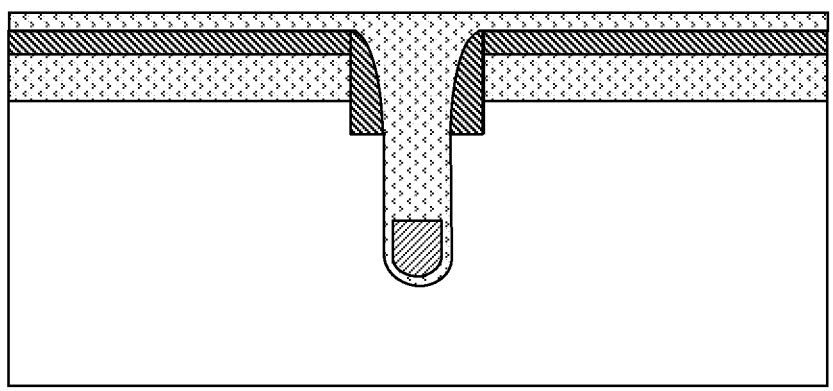
Figure 23L:
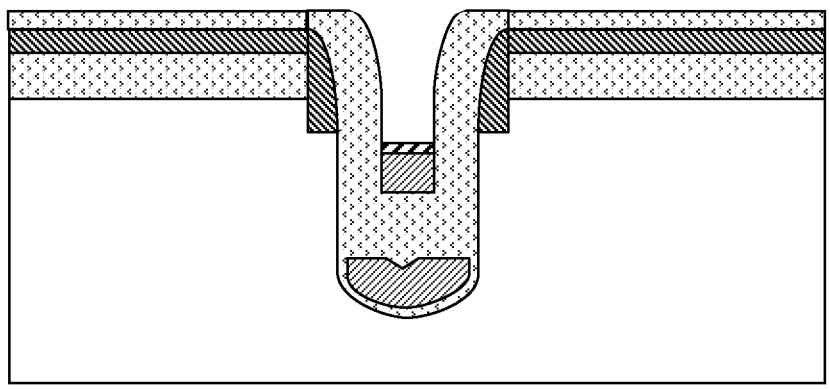

In FIGS. 23AA'-23LL', body implant takes place. The device is bombarded with dopant ions. The ions may be implanted at an angle. In active areas unprotected by nitride, the implant forms body regions such as 2304. In some embodiments, Boron ions with a dosage level of approximately $1.8 \times 10^{13}$ at 60 KEV~180 KeV are used for an N-channel device. Other types of ions can be used. For example, Phosphorous ions can be used for P-channel devices.

Figure 24A:
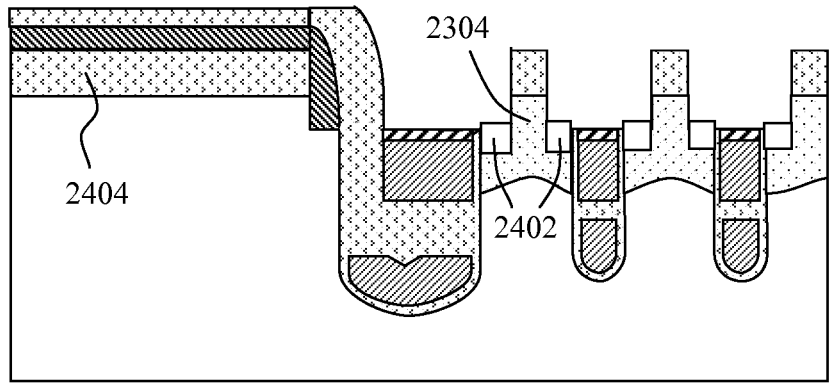
Figure 24B:
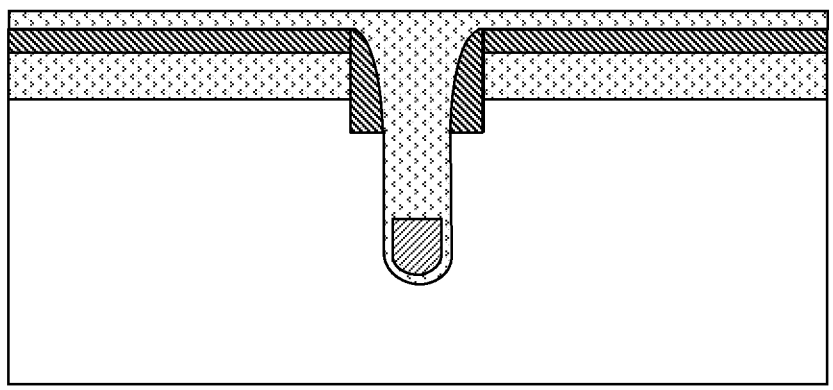
Figure 24L:
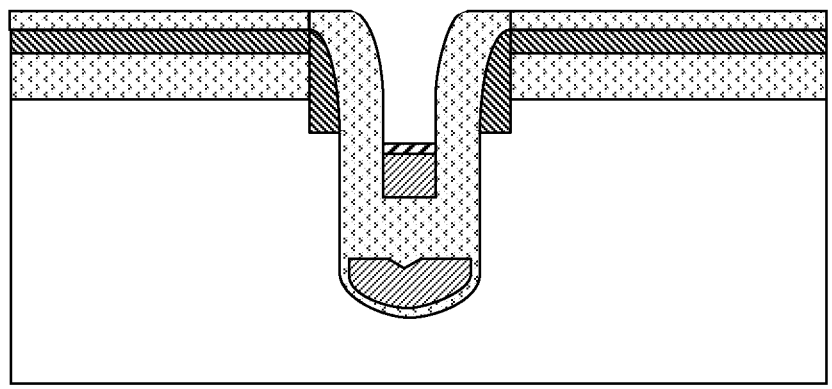

In FIGS. 24AA'-24LL', source implant takes place with a zero tilt angle (i.e., at normal incidence). The device is again bombarded with dopant ions. In some embodiments, Arsenic ions with a dosage level of $4 \times 10^{15}$ ions/cm$^2$ at 40 KeV~80 KeV are used. Source regions such as 2402 are formed within body regions such as 2304. Furthermore, because the source poly pickup contacts are located outside the active regions, the problem of a low breakdown voltage path due to blocking of the implant by the oxide overhang is easily avoided.

No additional mask is required to implant the body and the source of the device. The body and source implants can be performed as self-aligned blanket implants. In termination areas such as 2404, the oxide-nitrite-oxide barrier blocks implant ions and prevents source and body regions from being formed, thus improving device behavior in its off or blocking state.

Figure 25A:
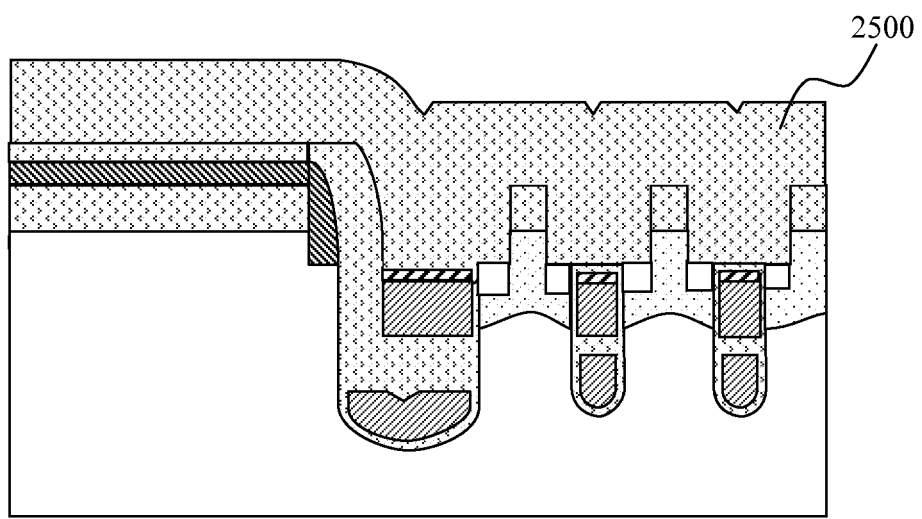
Figure 25B:
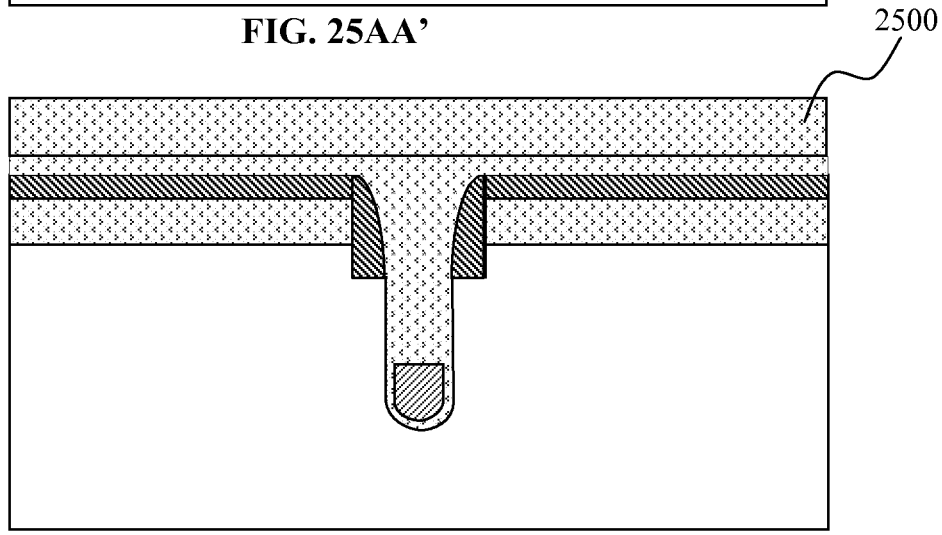
Figure 25L:
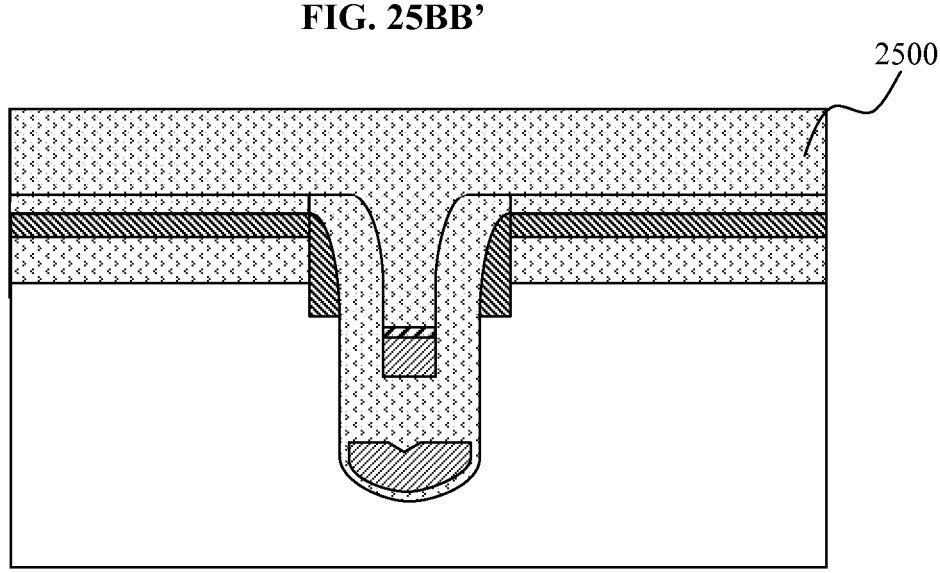

In FIGS. 25AA'-25LL', oxide 2500 ranging from 5000 Å~8000 Å is deposited to fill trench openings and block source and gate poly regions. In some embodiments, a chemical vapor deposition (CVD) process is used to deposit Low Temperature Oxide (LTO) and Boron Phosphorus Silicate Glass (BPSG) to a thickness of approximately 5000 Å.

Figure 26A:
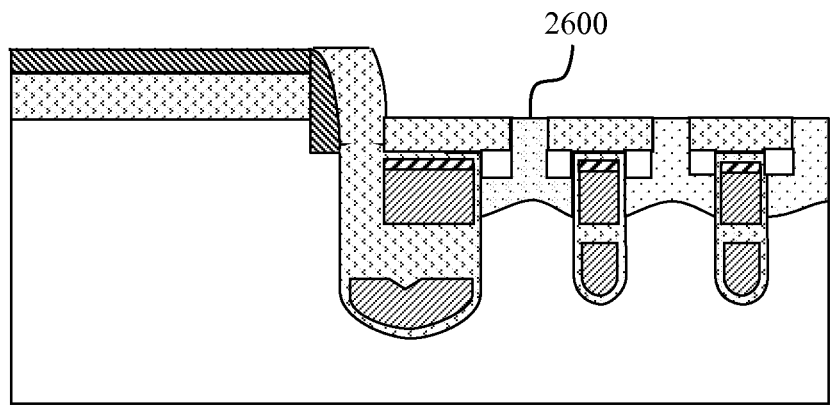
Figure 26B:
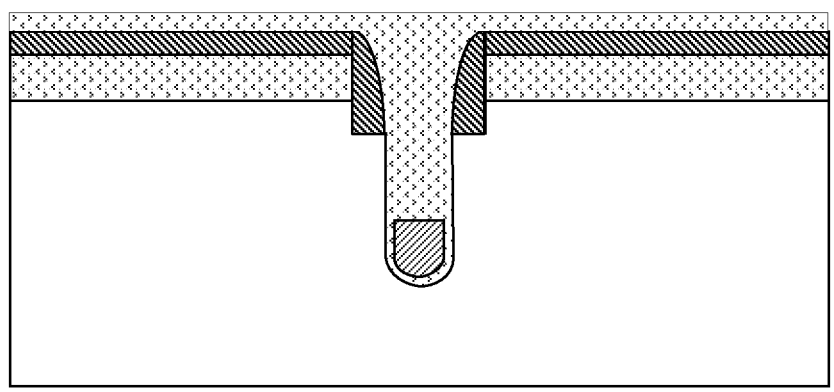
Figure 26L:
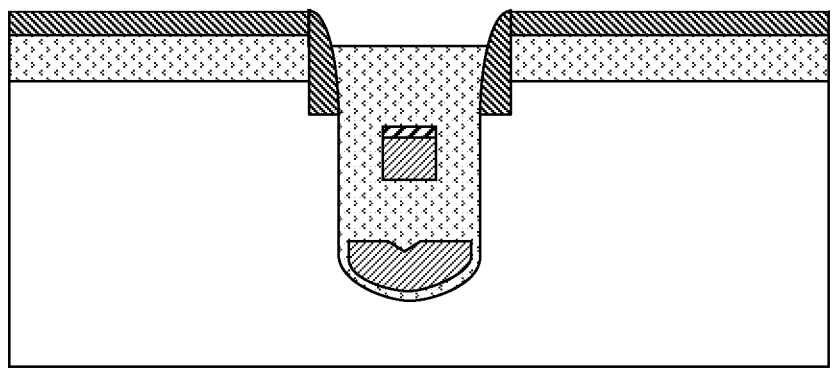

In FIGS. 26AA'-26LL', the oxide is etched back through a dry etch process where the oxide is etched down and stopped by endpoint etch on the active cell semiconductor surface 2600 corresponding to semiconductor mesas. The oxide adjacent to the active cell semiconductor surface 2600 will act as a self-aligned hard mask for the next step.

Figure 27A:
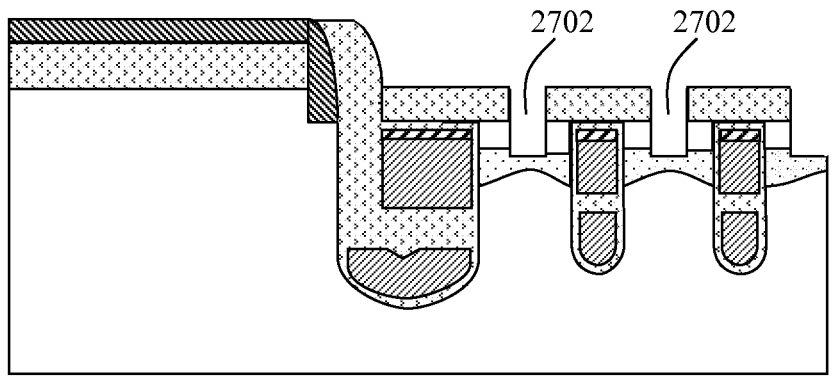
Figure 27B:
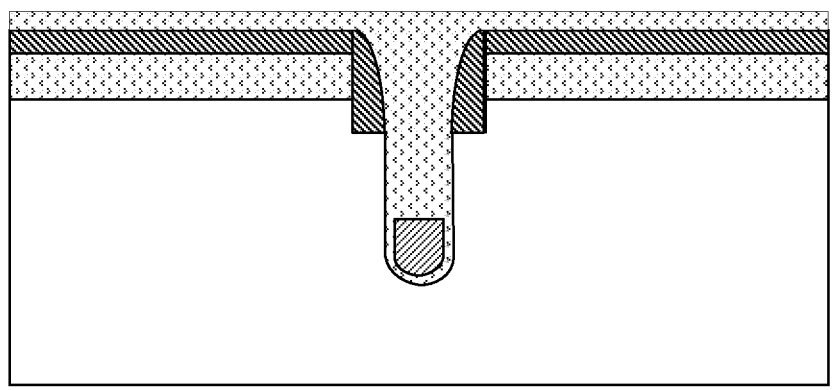
Figure 27L:
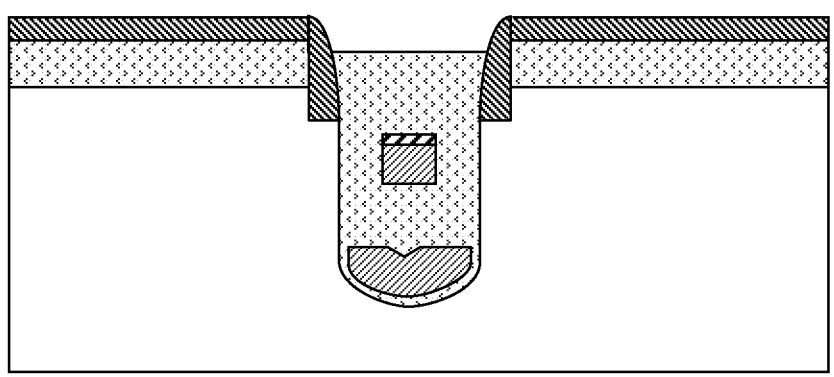

A silicon blanket etch takes place and the results are shown in FIGS. 27AA'-27LL'. Source/body region contact trenches 2702, also known as active cell contact trenches are formed in the active cell areas for contact to the source and body regions. The silicon etch depth is range from 0.6 μm~0.9 μm depending on device applications. Exposed silicon areas are etched, while areas protected by oxide and/or nitride are not etched. Since the etching process does not require an additional mask, it is referred to as a self-aligned contact process. The self-aligned nature of the active cell contact trenches is made possible because the nitride spacers formed near the beginning of the process preserved semiconductor mesas until this point.

Another layer of PR 2800 is applied and a third mask is used. FIG. 4 is a diagram illustrating an example of a third mask. The third mask is also referred to as a pickup mask or contact mask. The cross-hatched portions of FIG. 4 show the openings in the PR 2800 formed by the third mask. In this example, features that are formed by the mask include gate pickup contacts such as 402, and source poly pickup contacts such as 404.

Figure 28A:
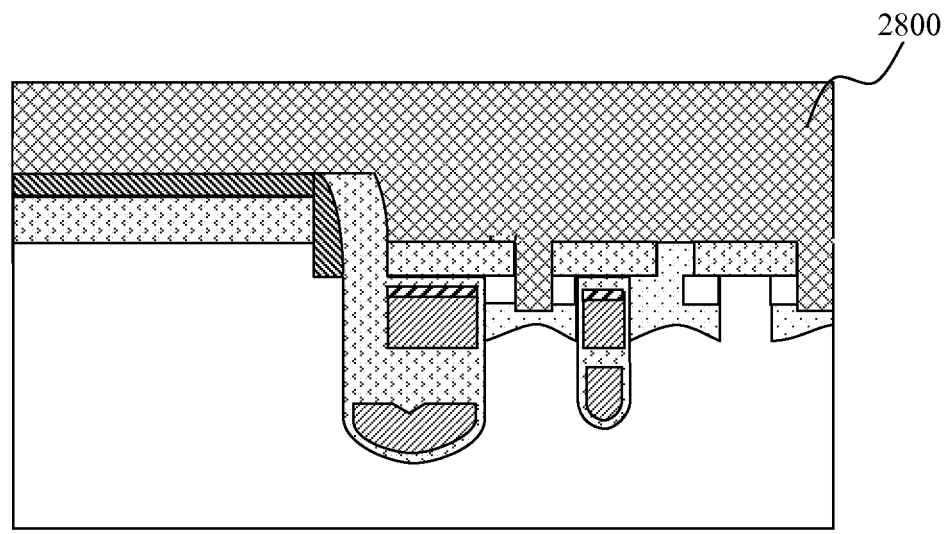
Figure 28B:
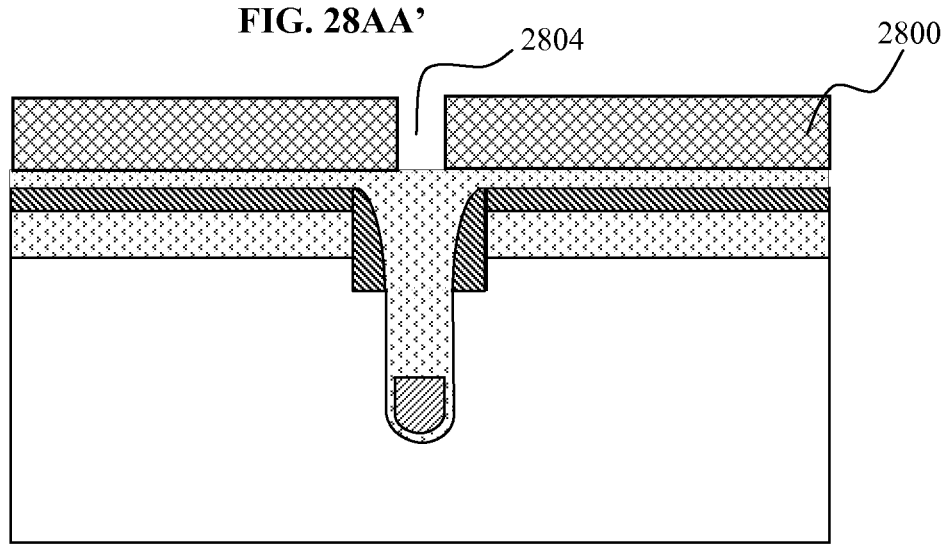
Figure 28L:
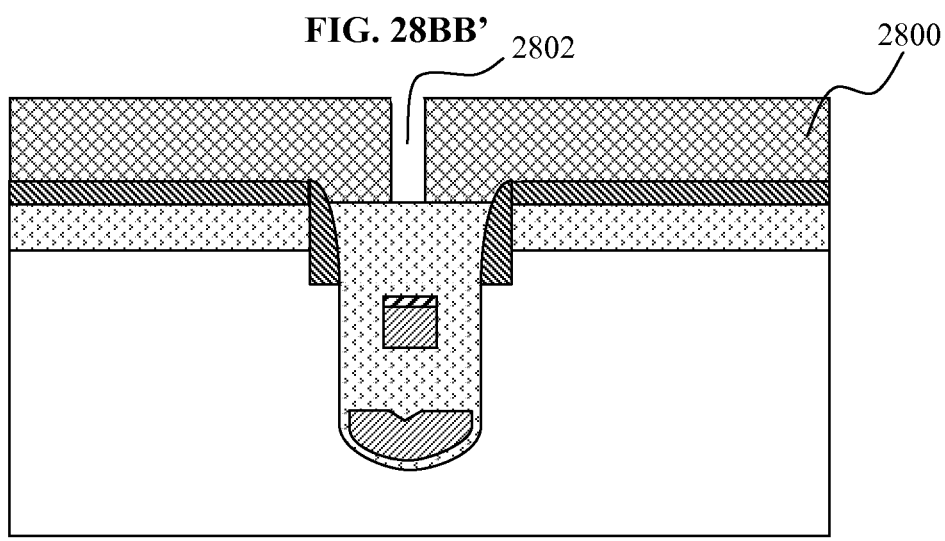

In FIGS. 28AA'-28LL', contact patterns are formed by removing exposed PR. Contact openings are formed for the source pickup opening 2804 shown in FIG. 28BB', and for the gate pickup opening 2802 shown in FIG. 28LL'.

Figure 29A:
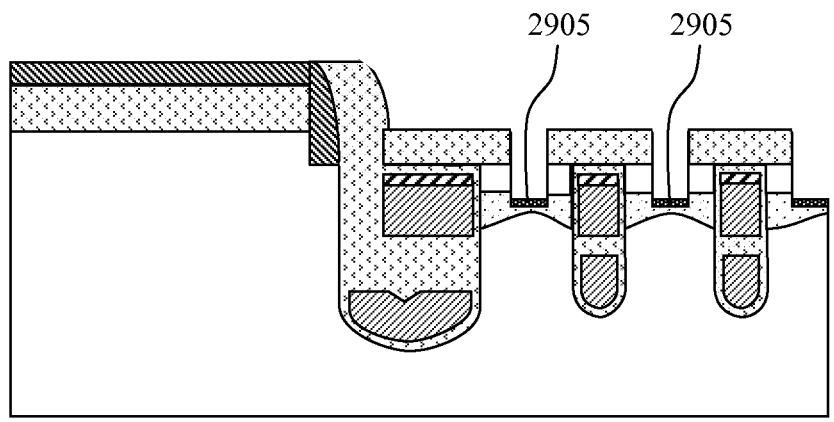
Figure 29B:
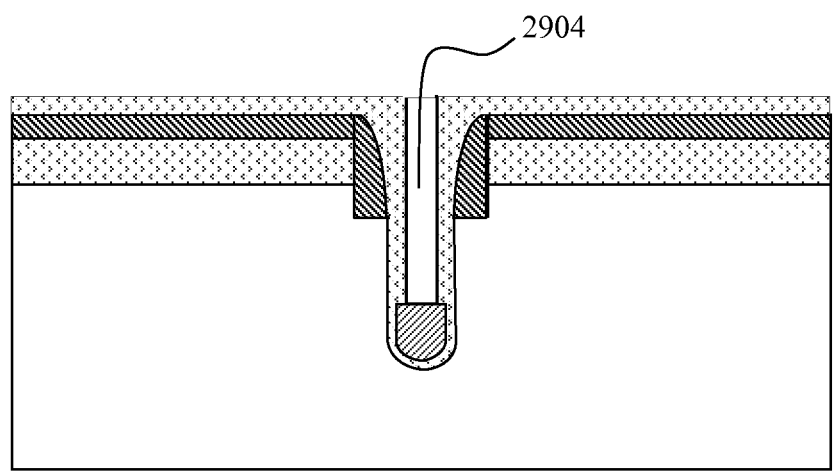
Figure 29L:
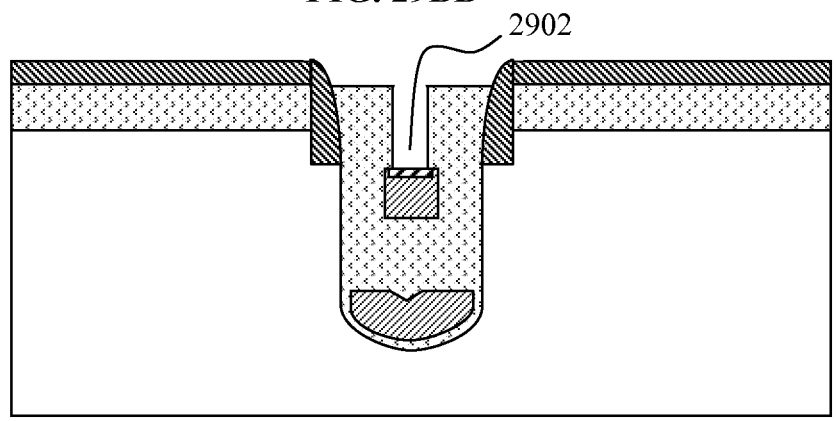

In FIGS. 29AA', 29BB' and 29LL', contact etch is performed as an oxide etch. Source poly pickup trench 2904 is etched in FIG. 29BB', and gate pickup trench 2902 is etched in FIG. 29LL'. The source poly has been etched down deep throughout the device, and a deep source poly pickup trench 2904 is needed to form a pickup contact to it. PR is then removed. Body contact implant is performed. In this example, P-type material (for example BF$_2$ ions at a dosage level of $1.0 \times 10^{15}$ at 40 KeV) is used to form body contact implants such 2905. The implantation process is followed by contact implant activation. In some embodiments, the contact implant activation process is a Rapid Thermal Process (RTP)

at approximately 1000° C. for 30 seconds. Alternatively, Active Thermal Drive can be used to activate the contact implant. Note that the gate poly and source poly are heavily doped N type (for n-channel devices) and are not affected by the body contact implant.

Figure 30A:
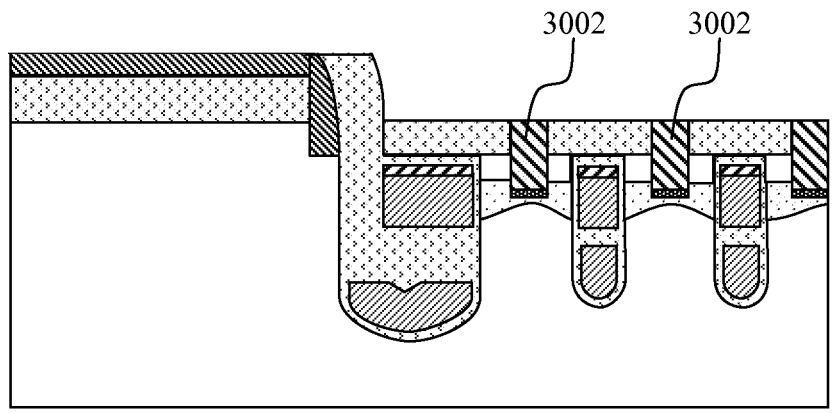
Figure 30B:
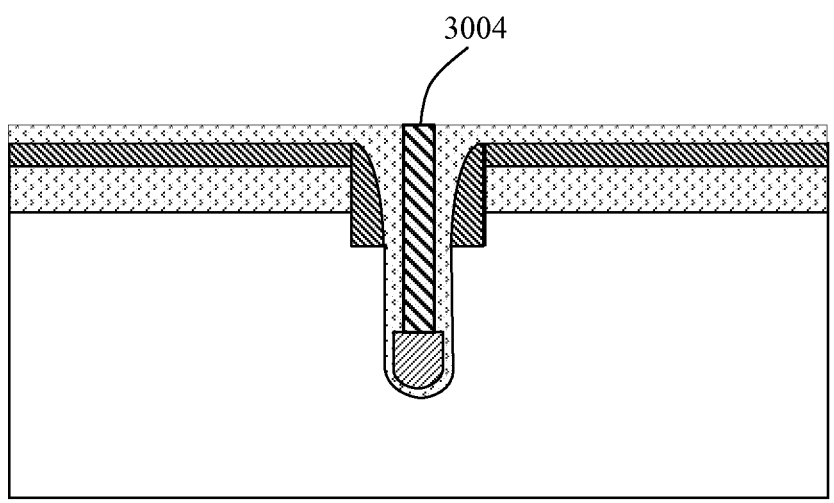
Figure 30L:
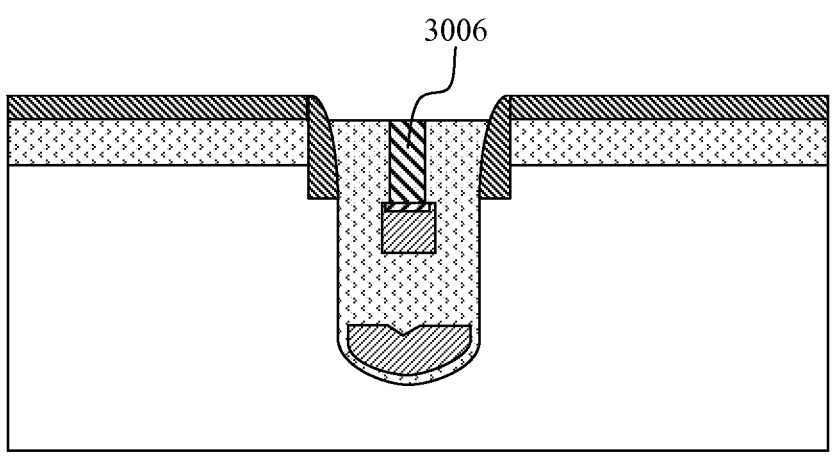

In FIGS. 30AA', 30BB' and 30LL', barrier metal such as Ti and TiN are deposited, followed by RTP to form Ti silicide near the contact region. The thicknesses of Ti and TiN used in some embodiments are 300 Å and 1000 Å, respectively. Tungsten (W) is then deposited. In some embodiments 4000 Å~6000 Å of W is deposited. The deposited W is etched back up to the oxide surface to form individual W plugs such as 3002, 3004, and 3006.

A fourth mask will be used to form a source metal region and a gate metal region. FIG. 5 is a diagram illustrating an example of a fourth mask, also referred to as a metal mask. Shaded regions 502 and 504 correspond to the source metal and the gate metal, respectively. The un-shaded portion corresponds to metal portion that is etched away to separate the source metal region and the gate metal region.

Figure 31A:
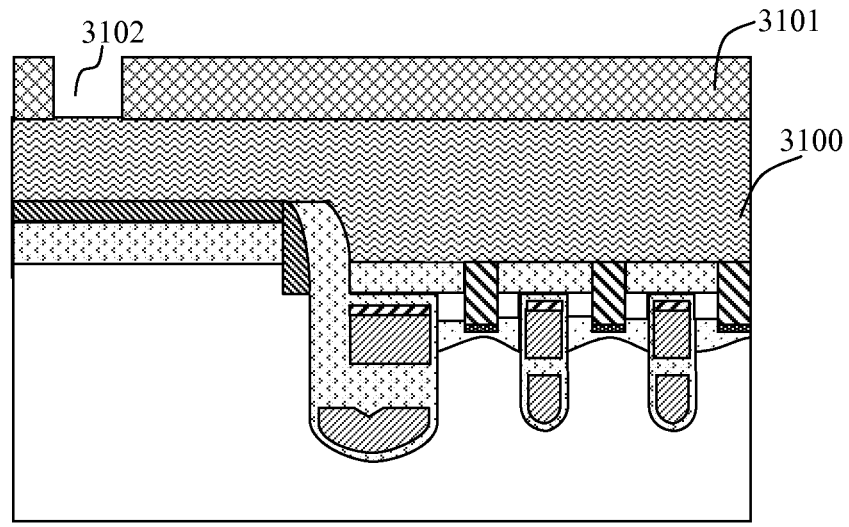
Figure 31B:
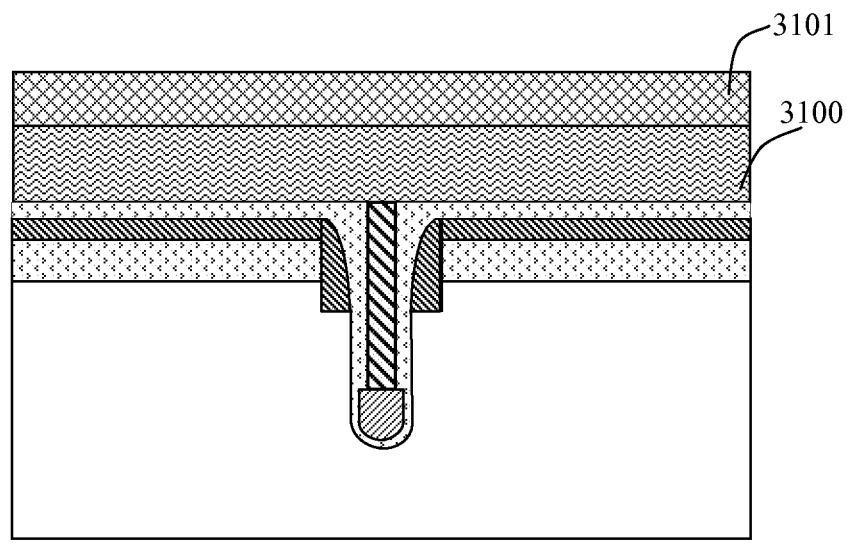
Figure 31L:
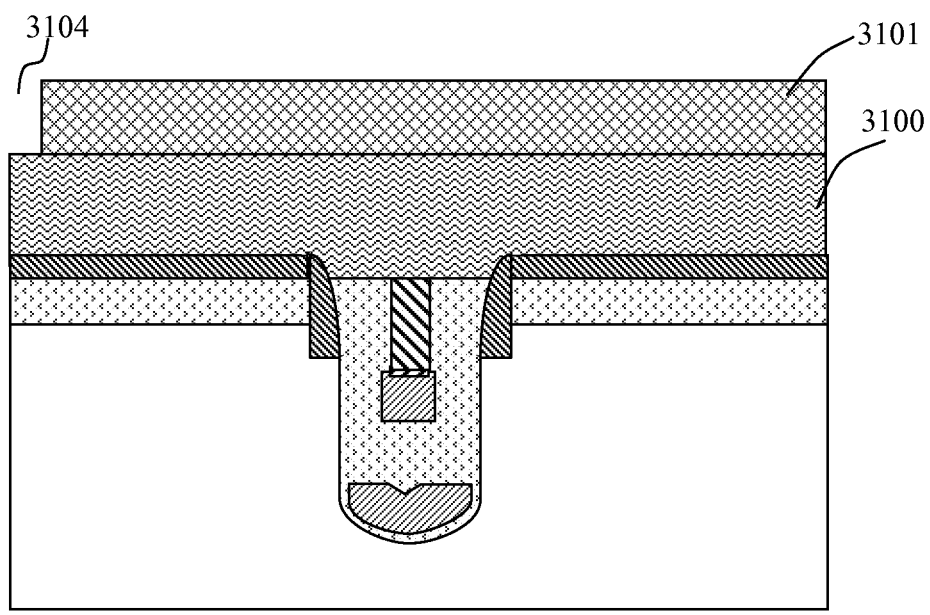

In FIGS. 31AA'-31LL', a metal layer 3100 is deposited. In some embodiments, Aluminum-Copper (AlCu) can be used to form a metal layer that is approximately 3 µm~6 µm thick. PR 3101 is then deposited and patterned using the metal mask. Metal under openings such as 3102 and 3104 is etched away.

Figure 32A:
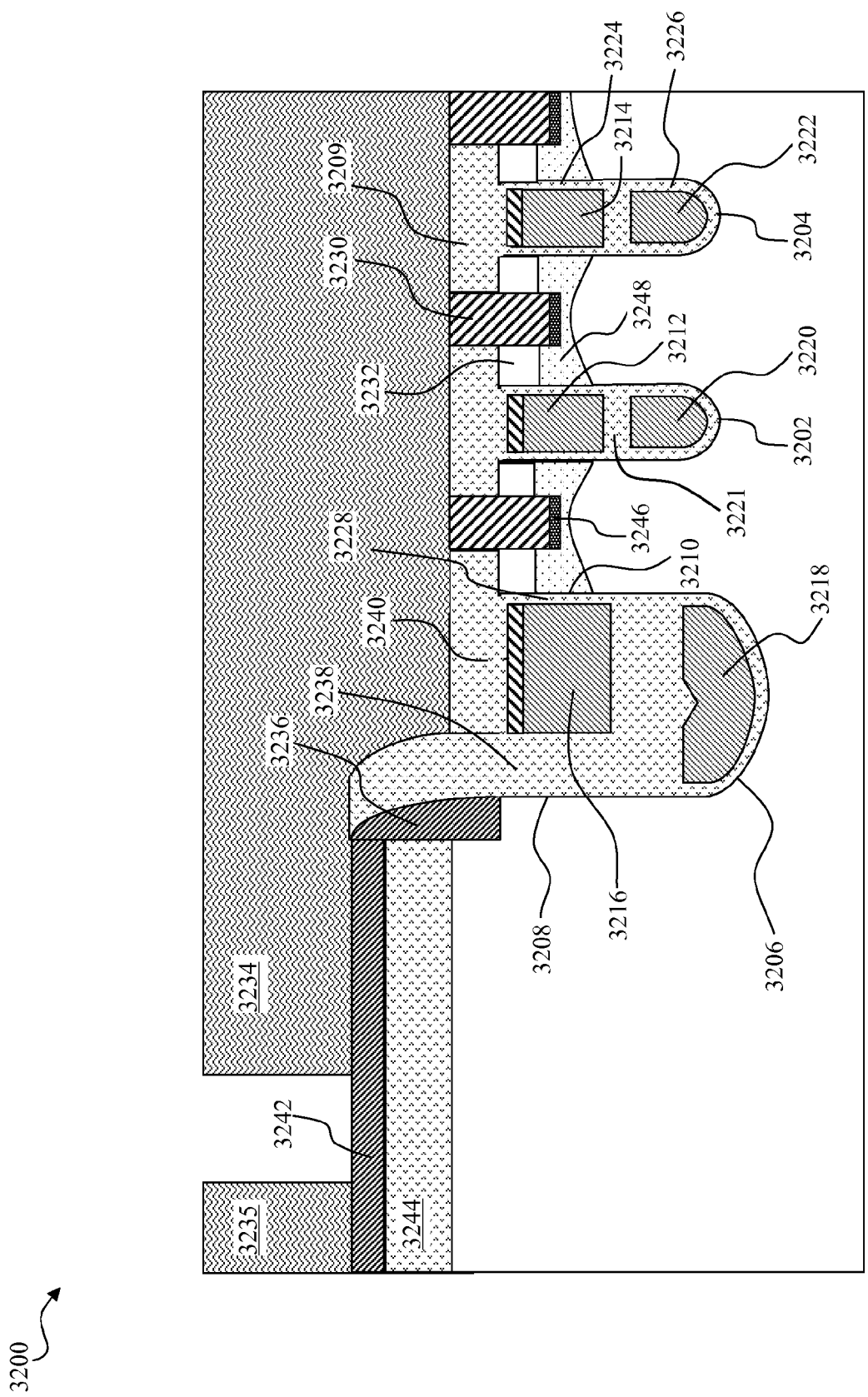

The residual PR layer is removed, and the metal is annealed. In some embodiments, the metal is annealed at 450° C. for 30 minutes. FIG. 32AA' is a cross sectional diagram illustrating the AA' cross section of an example of a completed device according to an embodiment of the present invention. In this example, the source, body, and metal regions of the device are shown as labeled. Device 3200 includes an asymmetric trench 3206, and active gate trenches 3202 and 3204. Asymmetric trench 3206 serves as a termination trench separating a high potential area (i.e. the drain) from a low potential area (i.e., the source). In trench 3206, sidewall 3208 is in close proximity to the termination region and sidewall 3210 is in close proximity to the active region. The oxide layer 3238 lining between sidewall 3208 and top gate poly 3216 is thicker than the oxide layer 3228 lining between sidewall 3210 and top gate poly 3216. The thicker oxide layer provides better shielding of low potential areas such as the gate and source from high potential areas such as the drain, and improves the device's breakdown voltage (BV). As will be described in connection with FIG. 32LL', trench 3206 also serves the additional purpose of a gate runner trench that surrounds the active area and interconnects with active gate trenches and the gate pickup.

The asymmetric trench and the active gate trenches each include a top poly electrode (e.g., poly 3216, 3212, or 3214), also referred to as the gate poly since it function as the gate, or poly 2 since it is formed from the second poly deposition process during fabrication. Each top poly electrode may further include a polycide layer 3240 formed on top surface of gate electrode to improve the conductivity along the gate. Each trench further includes a bottom poly electrode (e.g., poly 3218, 3220, and 3222), also referred to as the source poly since it is connected to the source, or poly 1 since it is formed from the first poly deposition process during fabrication, or shield poly since it shields the gate poly from high voltages. The gate poly is separated from the source poly by inter-poly dielectric regions 3221 formed by oxide. In the active gate trenches shown in this example, the oxide layer (e.g., active gate oxide 3224) that surrounds the gate poly and lines the sidewalls of the top portion of the trench is thinner than the oxide layer (e.g. oxide layer 3226) surrounding the source/ shield poly and lining the sidewalls of the bottom portion of the trench. Further, oxide layer 3228 is substantially the same thickness as the active gate oxide 3224 as they are formed in the same process. In active area source metal 3234 is insulated from gate electrodes 3212, 3214 and 3216 by a dielectric layer such as oxide 3209. Source metal layer 3234 electrically connects to source regions 3232 and body regions 3248 through a conductor 3230 such as Tungsten plug that fills the source body contact openings and extends from source metal penetrating through the source regions into the body regions. Body contact implant regions 3246 improve the Ohmic contact between the body regions and the conductor 3230. In the termination area, oxide 3238 extends along nitride spacer 3236 to substantially the same top surface of nitride layer 3242. Nitride layer 3242 and nitride spacer 3236 seal the oxide layer 3244 deposited on the top surface of epi layer in termination area. The bottom of oxide layer 3244 or the top surface of epi layer in termination area is substantially aligned with the top surface of oxide layer 3209 in the active area. Further, the bottom of nitride spacer 3236 serves as a reference to align the top surface of source regions 3232. The top surfaces of top gate electrodes 3212, 3214 and 3216 may be recessed from this reference mark and lie below the top surface of the source regions 3232. Gate metal 3235 disposed on top of nitride layer 3242 is separated from source metal 3234 and electrically connects to the gate poly electrode in another location as shown in FIG. 32LL'.

Figure 32B:
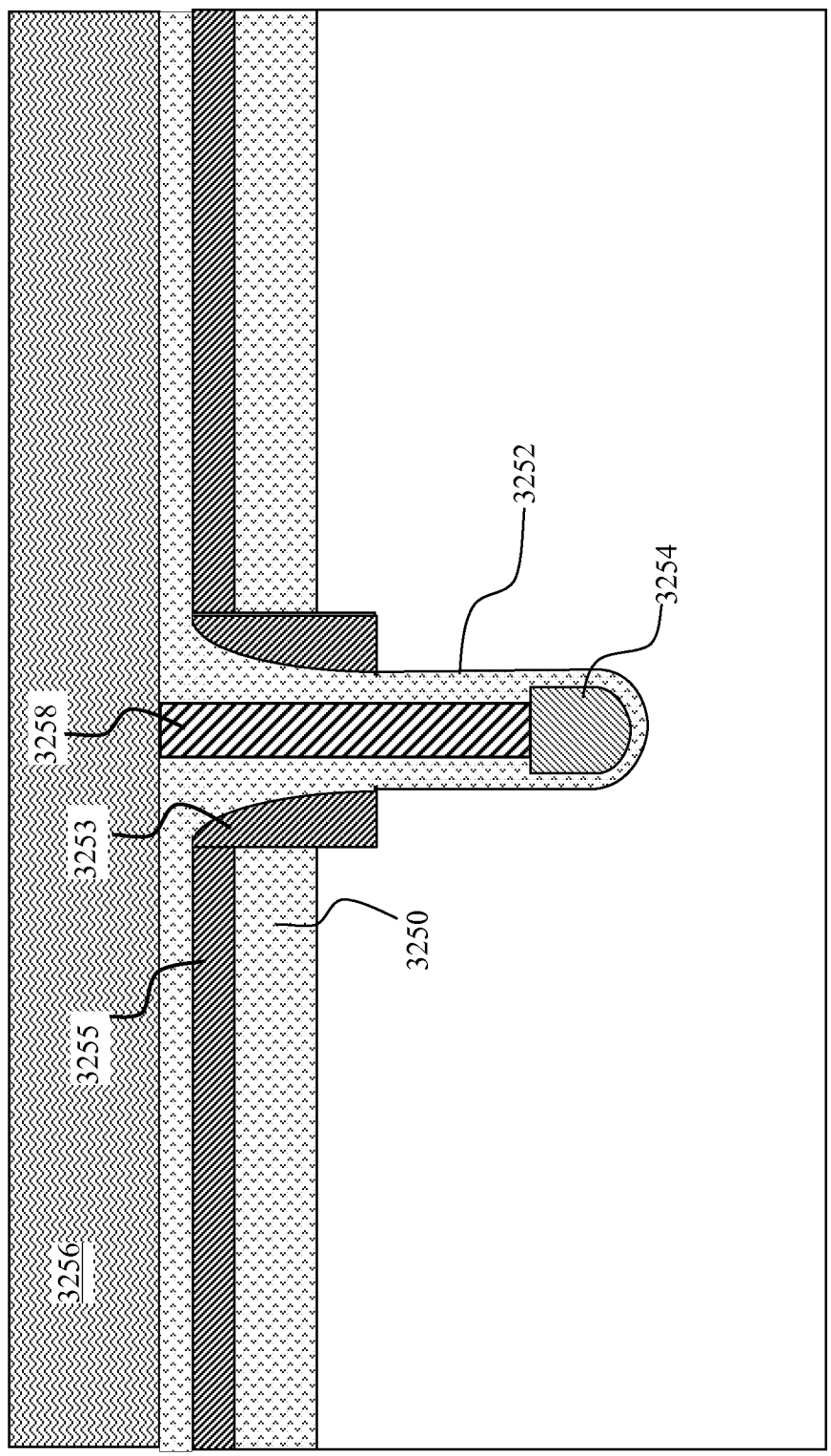

FIG. 32BB' is a cross sectional diagram illustrating the BB' cross section of the completed device. In this example, source pickup trench 3252 has a source polysilicon electrode 3254 that is electrically connected to the source metal 3256 via a metal conductor such as a tungsten plug filling a contact hole 3258 within the trench 3252. The source pickup trench 3252 is located outside the active area depicted in FIG. 32AA'. The contact hole has a width narrower than the polysilicon electrode and extends vertically from the top surface of the source polysilicon electrode 3254 to source metal layer 3256 deposited on top surface. A thick oxide 3250 covers the regions surrounding the source poly pickup trench 3252. In some embodiments, the source poly pickup trench 3252 may be wider and deeper than the active gate trenches 3202 and 3204 as shown in FIG. 32AA'—this facilitates, the formation of the deep contact hole 3258 needed to form a contact with the source poly 3254. In some other embodiments the source poly pickup trenches 3252 may be narrower and shallower than the active gate trenches. A nitride spacer 3253 disposed in proximity to the top portion of source pickup trench sidewall and the nitride layer 3255 blocks body implant from the entire region. Since the source/body contacts are not located in these areas at all, the low BV pathway problem of the prior art is not a concern.

Figure 32L:
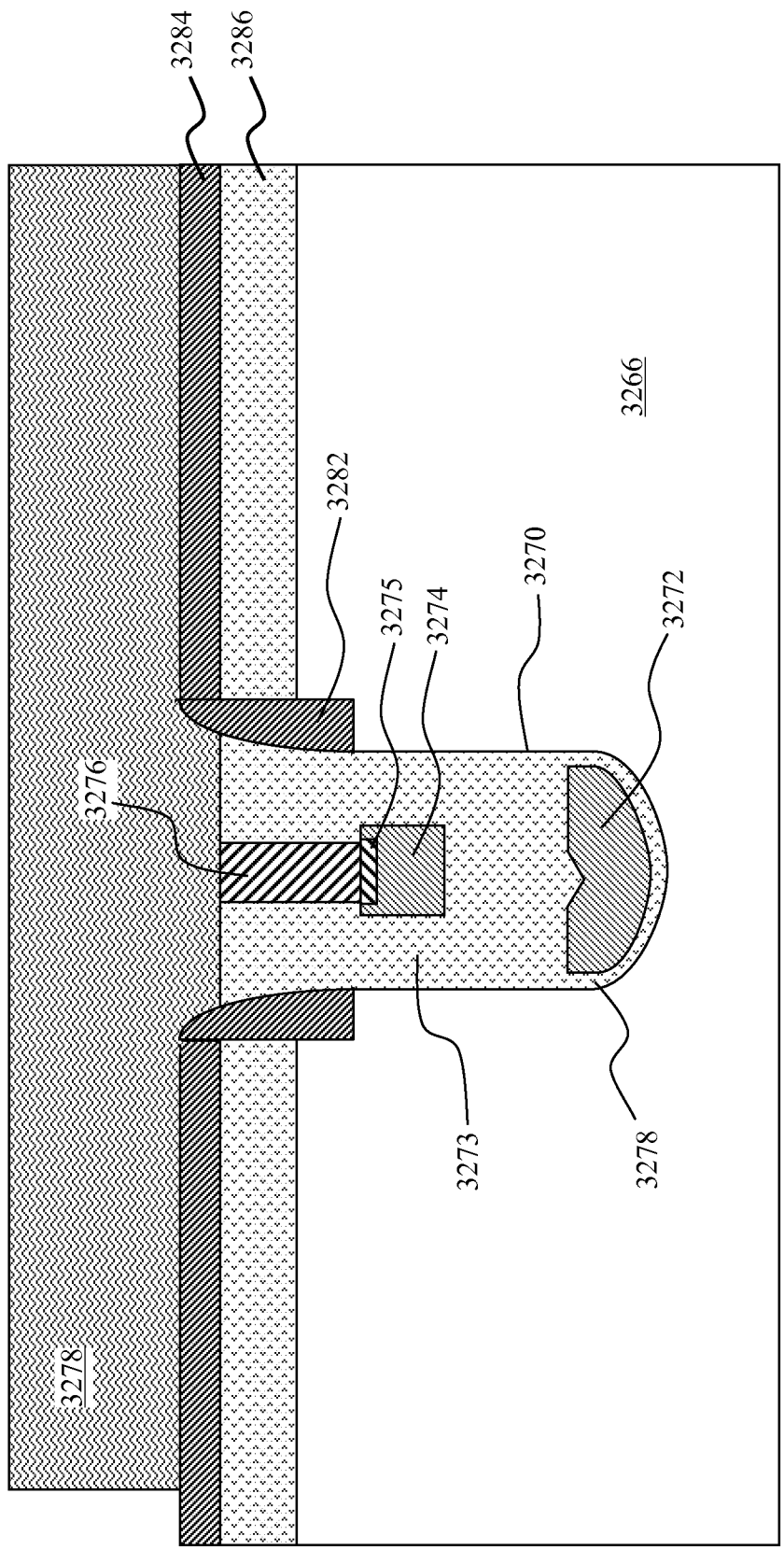

FIG. 32LL' is a cross sectional diagram illustrating the LL' cross section of the completed device. Unlike the asymmetric termination/gate runner trench 3206 in FIG. 32AA', gate pickup trench 3270 in FIG. 32LL' (which is an extension trench of gate runner trench 3206) exhibits a substantially symmetric structure in reference to the center line of the trench. The oxide surrounding the gate poly 3274 is thicker than the oxide at the bottom of the gate pickup trench 3270. In this example, source/shield poly 3272 and gate poly 3274 are embedded in gate pickup trench 3270. The thicknesses of oxide layers 3273 deposited or otherwise formed between the gate poly 3274 and the sidewalls of the upper portion of the trench is substantially uniform and is substantially thicker than the oxide layers (e.g. oxide layer 3278) surrounding the source/shield poly 3272 and lining the both sidewalls of the bottom portion of the trench. The top surface of the gate poly 3274 is recessed from the top surface of epi substrate 3266 and has a polycide layer 3275 for improving gate conductivity along the gate trench. A tungsten plug filling a contact hole 3276 opened within the gate pickup trench extends from the top of gate poly to the gate metal layer 3278 deposited on top surface of nitride layer 3284, and electrically connects the gate poly electrode 3274 with gate metal 3278. Nitride spacer 3282 in proximity to the top portion of the gate pickup trench sidewall extends to the top surface of nitride layer 3284. Nitride layer 3284 and nitride spacer 3282 seal an oxide layer 3286 deposited or otherwise formed on the top surface of epi substrate in termination area. The top surface of gate electrode 3274 lies below the bottom of nitride spacer 3282. Gate pickup trench 3270 is wider than the active gate trench.

Figure 33:
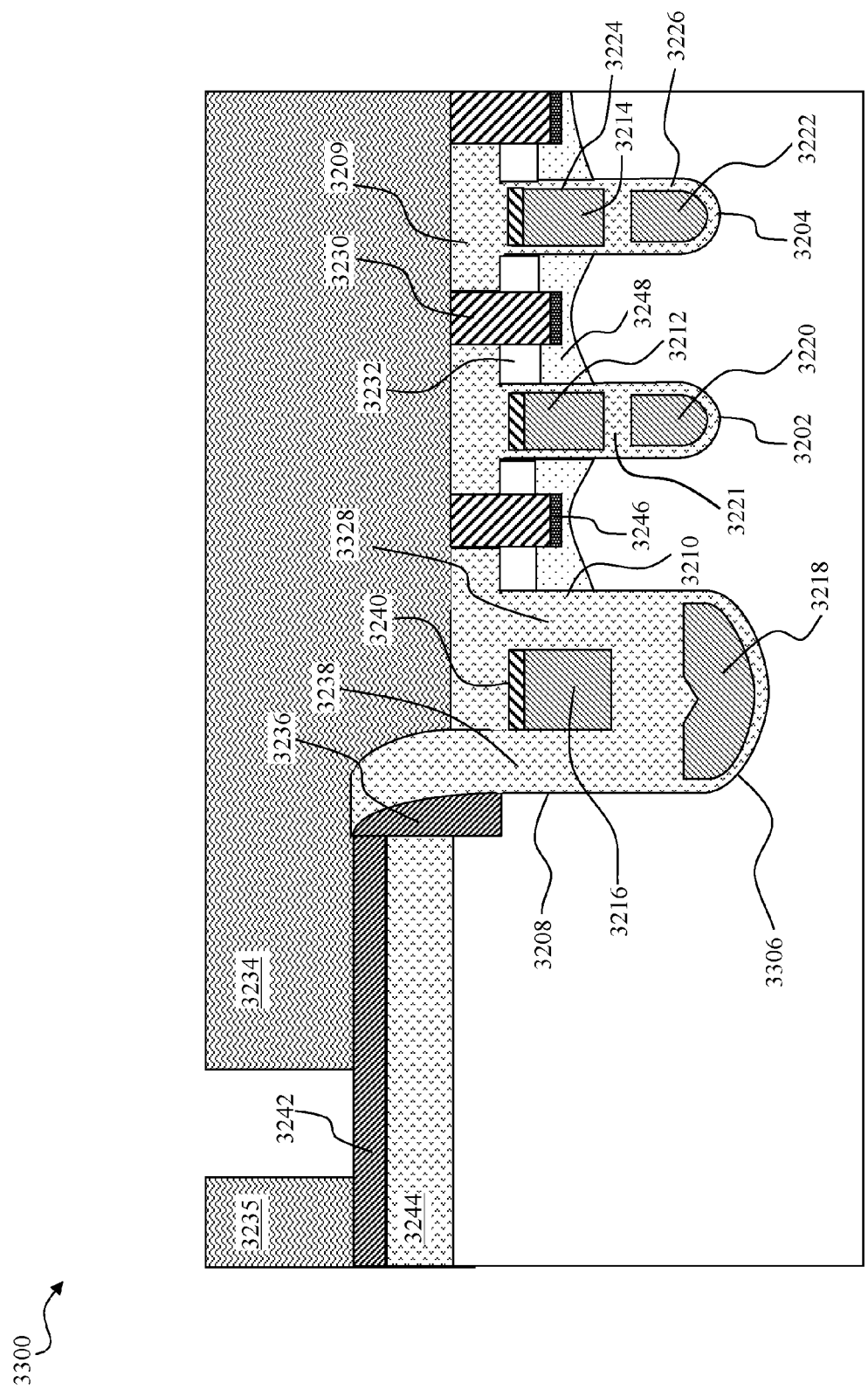
FIG. 33 is a cross sectional diagram of an alternative shielded gate MOSFET along the line AA'.

The above embodiment provides a MOSFET device with a gate runner trench having an asymmetric structure in some sections (such as AA') and a substantially symmetric structure in other sections (such as LL'). Depending on the mask design, alternative embodiments may be produced following the same process. In one alternative embodiment, the device 3300 shown in FIG. 33 has a termination/gate runner trench 3306 having a substantially symmetric oxide sidewall thickness similar to that of FIG. 32LL' rather than the asymmetric structure of FIG. 32AA'. The oxide sidewalls 3238 and 3328 of gate runner/termination trench 3306 are both substantially thicker than the active gate oxides 3224.

Figure 34:
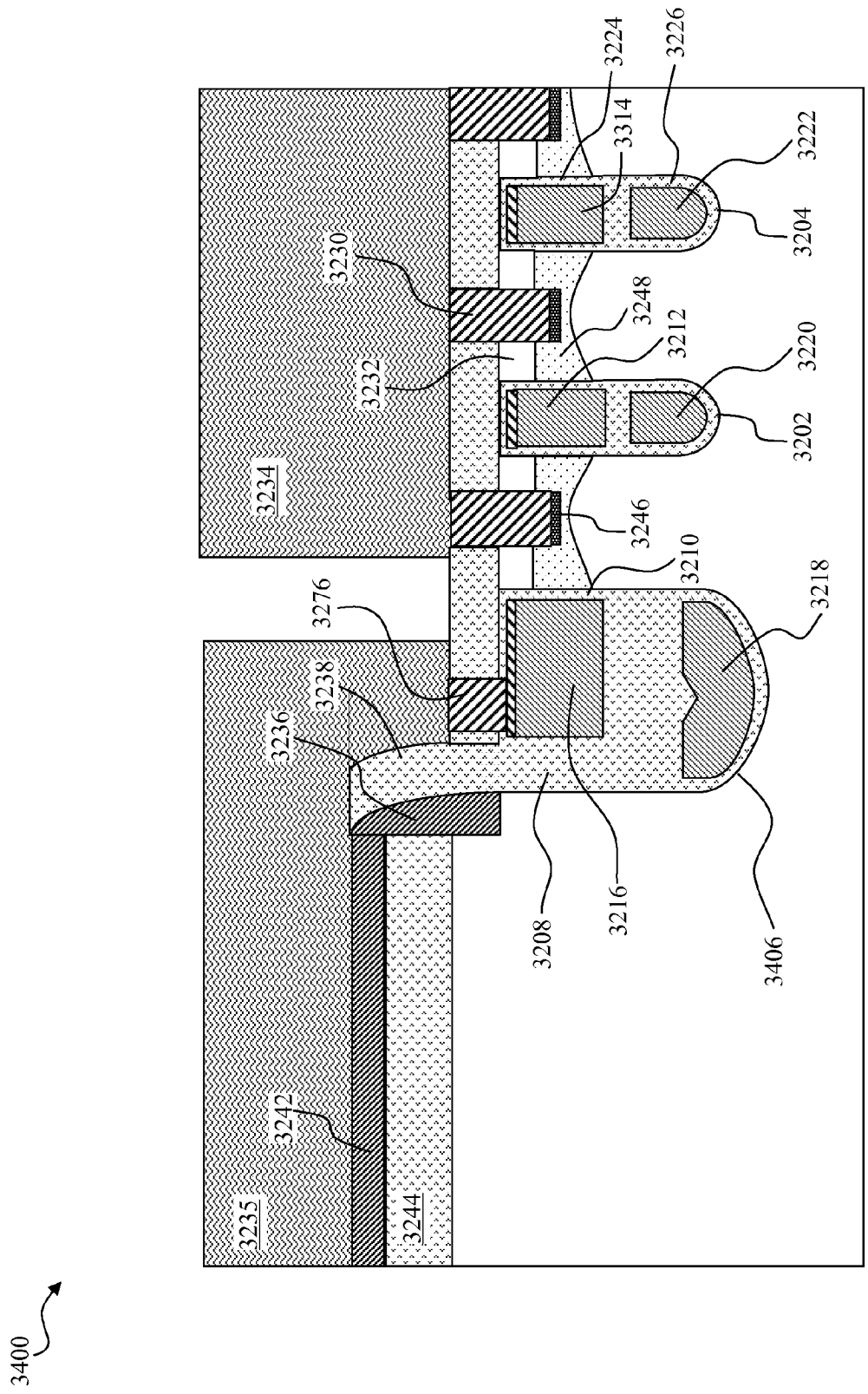
FIG. 34 is a cross sectional diagram of another alternative shielded gate MOSFET along the line AA'.

In some other embodiments, gate contact hole may be disposed on top of asymmetric termination/gate runner trench to directly pickup gate contact to the gate metal. The termination/gate runner trench, therefore, also serves as gate pickup trench. As shown in FIG. 34, device 3400 has a similar structure as device 3200 in FIG. 32AA', except a gate contact hole 3276 is disposed on top of asymmetric termination/gate runner trench 3406, and the gate metal 3235 and source metals 3234 are separated The above examples mostly illustrate N-type devices. The techniques described are also applicable to P-type devices, in which polarities of various dopants are reversed.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device comprising:
   a semiconductor layer;
   a plurality of trenches formed in the semiconductor layer, the plurality of trenches include active gate trenches located in a first active area and a second active area, gate runner/termination trenches and a source pickup trench located in a termination area between the first and second active areas, wherein a first conductive region is located at a bottom portion of the active gate, gate runner/termination and source pickup trenches and a second conductive region is located at a top portion of the active gate and gate runner/termination trenches, and wherein the first and second conductive regions are separated by an intermediate dielectric region in the active gate and gate runner/termination trenches; and
   a source metal extending from the first active area through the termination area to the second active area, wherein the source metal is connected through a source contact to the first conductive region of the source pickup trench located in the termination area between the first and second active areas.

2. The semiconductor device of claim 1 wherein a gate metal electrically connected to the second conductive regions.

3. The semiconductor device of claim 1, wherein the source pickup trench is surrounded by adjacent gate runner/termination trenches.

4. The semiconductor device of claim 1 wherein the gate runner/termination trench is asymmetrical, wherein an insulator on a first sidewall of the gate runner/termination trench is thicker than an insulator on a second sidewall of the gate runner/termination trench, the first sidewall being closer to the termination area than the second sidewall.

5. The semiconductor device of claim 1 wherein the gate runner/termination trenches are wider than the active area trenches and the source pickup trenches.

6. The semiconductor device of claim 1 wherein the top of the first conductive region is etched back deeply throughout the device and the source contact is a deep contact to the first conductive region.

7. The semiconductor device of claim 1 further comprising a gate pickup trench extending from the gate runner/termination trenches, wherein the oxide around the second conductive region in the gate pickup trench is thicker than the oxide at the bottom of the gate pickup trench.

8. The semiconductor device of claim 1 wherein an insulator around the second conductive region in the gate pickup trench is thicker than an insulator at the bottom of the gate pickup trench.

9. The semiconductor device of claim 1, wherein the source pickup trench is surrounded by adjacent gate runner/termination trenches.

10. The semiconductor device of claim 1, wherein the gate runner/termination trenches include a trench that encloses the first and second active areas and the source pick up trench.

11. A semiconductor device comprising:
    a semiconductor layer;
    a plurality of trenches formed in the semiconductor layer, the plurality of trenches include active gate trenches located in an active area, gate runner/termination trenches and source pickup trench located in a first termination area and gate runner/termination trench and gate pickup trenches located in a second termination area separated from the first termination area by the active area wherein a first conductive region is located at a bottom portion of the active gate, gate runner/termination, gate pickup and source pickup trenches and a second conductive region is located at a top portion of the active gate, gate pickup and gate runner/termination trenches, and wherein the first and second conductive regions are separated by an intermediate dielectric region;
    a gate pickup contact connected to the second conductive regions of the gate pick up trenches located in the second termination area;
    a source pickup contact connected to the first conductive region of the source pickup trenches located in the first termination area, wherein the source pickup contact connects to a source metal extending from the active area to the first termination area.

12. The semiconductor device of claim 11 wherein the gate runner/termination trench is asymmetrical, wherein an insulator on a first sidewall of the gate runner/termination trench is thicker than an insulator on a second sidewall of the gate runner/termination trench, the first sidewall being closer to the termination area than the second sidewall.

13. The semiconductor device of claim 11 wherein the gate runner/termination trenches are wider than the active area trenches and the source pickup trenches.

14. The semiconductor device of claim 11 wherein the top of the first conductive region is etched back deeply throughout the device and the source pickup contact is a deep contact to the first conductive region.

15. The semiconductor device of claim 11 wherein an insulator around the second conductive region in the gate pickup trench is thicker than an insulator at the bottom of the gate pickup trench.

16. The semiconductor device of claim 11, wherein the source pickup trench is surrounded by adjacent gate runner/termination trenches.

* * * * *